(12) United States Patent
Tanimoto et al.

(10) Patent No.: US 10,126,473 B2
(45) Date of Patent: Nov. 13, 2018

(54) DISPLAY DEVICE AND LAMINATED OPTICAL FILM

(71) Applicant: Murata Manufacturing Co., Ltd., Nagaokakyo-shi, Kyoto (JP)

(72) Inventors: Kazuhiro Tanimoto, Nagoya (JP); Mitsunobu Yoshida, Ichihara (JP); Shigeo Nishikawa, Chiba (JP)

(73) Assignee: MURATA MANUFACTURING CO., LTD., Nagaokakyo-shi, Kyoto (JP)

( * ) Notice: Subject to any disclaimer, the term of this patent is extended or adjusted under 35 U.S.C. 154(b) by 340 days.

(21) Appl. No.: 14/764,514

(22) PCT Filed: Jan. 28, 2014

(86) PCT No.: PCT/JP2014/051850
§ 371 (c)(1),
(2) Date: Jul. 29, 2015

(87) PCT Pub. No.: WO2014/119577
PCT Pub. Date: Aug. 7, 2014

(65) Prior Publication Data
US 2015/0362647 A1 Dec. 17, 2015

(30) Foreign Application Priority Data
Feb. 1, 2013 (JP) ................. 2013-018803

(51) Int. Cl.
*G02B 5/30* (2006.01)
*G02F 1/1335* (2006.01)
(Continued)

(52) U.S. Cl.
CPC ........... *G02B 5/30* (2013.01); *G02F 1/13363* (2013.01); *G02F 1/133528* (2013.01);
(Continued)

(58) Field of Classification Search
None
See application file for complete search history.

(56) References Cited

U.S. PATENT DOCUMENTS 5,288,551 A * 2/1994 Sato ............... B06B 1/0688
428/334
5,356,500 A * 10/1994 Scheinbeim ......... B29C 55/023
156/229
(Continued)

FOREIGN PATENT DOCUMENTS

EP 0 596 190 A * 5/1994
JP 05-152638 A * 6/1993
(Continued)

OTHER PUBLICATIONS

Extended Search Report issued by the European Patent Office in corresponding European Patent Application No. 14746449.9 dated Sep. 27, 2016 (11 pages).
(Continued)

*Primary Examiner* — Vivian Chen
(74) *Attorney, Agent, or Firm* — Buchanan, Ingersoll & Rooney PC

(57) ABSTRACT

Provided is a display device containing a crystalline piezoelectric polymer layer having a helical chiral polymer (A) that has a weight average molecular weight of from 50,000 to 1,000,000 and has optical activity, an optical compensation layer satisfying the following expression (1), and a linear polarizer. In expression (1), Xc represents a degree of crystallinity (%) of the crystalline piezoelectric polymer layer obtained by a DSC method; MORc represents a standardized molecular orientation of the crystalline piezoelectric polymer layer measured by a microwave transmission molecular orientation meter when a reference thickness is 50 μm; d represents a thickness (μm) of the crystalline piezoelectric polymer layer; and Rth represents a phase
(Continued)

difference (nm) in a thickness direction of the optical compensation layer at a wavelength of 550 nm.

$$|0.06 \times Xc \times MORc \times d + Rth| \leq 500$$ Expression (1):

20 Claims, 4 Drawing Sheets

(51) Int. Cl.

| | |
|---|---|
| G02F 1/13363 | (2006.01) |
| H01L 51/50 | (2006.01) |
| H01L 51/52 | (2006.01) |
| H01L 41/00 | (2013.01) |
| H01L 41/04 | (2006.01) |
| H01L 41/08 | (2006.01) |
| H01L 41/16 | (2006.01) |
| H01L 41/18 | (2006.01) |
| H01L 41/193 | (2006.01) |
| H01L 41/35 | (2013.01) |
| H01L 41/45 | (2013.01) |
| B32B 27/36 | (2006.01) |
| C08G 63/02 | (2006.01) |
| C08G 63/06 | (2006.01) |
| C08G 63/08 | (2006.01) |
| C08K 5/00 | (2006.01) |
| C08K 5/29 | (2006.01) |
| C08K 5/1515 | (2006.01) |
| C08L 67/04 | (2006.01) |
| G02F 1/1333 | (2006.01) |

(52) U.S. Cl.
CPC .......... *B32B 27/36* (2013.01); *B32B 2307/20* (2013.01); *B32B 2307/40* (2013.01); *B32B 2307/42* (2013.01); *B32B 2307/704* (2013.01); *B32B 2367/00* (2013.01); *C08G 63/02* (2013.01); *C08G 63/06* (2013.01); *C08G 63/08* (2013.01); *C08K 5/00* (2013.01); *C08K 5/005* (2013.01); *C08K 5/1515* (2013.01); *C08K 5/29* (2013.01); *C08L 67/04* (2013.01); *G02F 1/1335* (2013.01); *G02F 1/13338* (2013.01); *G02F 1/133636* (2013.01); *G02F 2001/13356* (2013.01); *G02F 2001/133394* (2013.01); *G02F 2001/133562* (2013.01); *G02F 2001/133638* (2013.01); *H01L 41/00* (2013.01); *H01L 41/04* (2013.01); *H01L 41/08* (2013.01); *H01L 41/0805* (2013.01); *H01L 41/16* (2013.01); *H01L 41/18* (2013.01); *H01L 41/193* (2013.01); *H01L 41/35* (2013.01); *H01L 41/45* (2013.01); *H01L 51/50* (2013.01); *H01L 51/52* (2013.01); *H01L 51/5293* (2013.01); *Y10T 428/31511* (2015.04); *Y10T 428/31565* (2015.04); *Y10T 428/31786* (2015.04)

(56) References Cited

U.S. PATENT DOCUMENTS

| | | | | |
|---|---|---|---|---|
| 5,432,396 A * | 7/1995 | Sato | ............ | B06B 1/0648 |
| | | | | 310/334 |
| 5,905,554 A * | 5/1999 | Kyu | ............ | G02F 1/133305 |
| | | | | 349/122 |
| 8,648,151 B2 * | 2/2014 | Yoshida | ............ | C08G 63/08 |
| | | | | 252/62.9 R |
| 9,136,461 B2 * | 9/2015 | Tanimoto | ............ | C08J 5/18 |
| 9,276,191 B2 * | 3/2016 | Ando | ............ | G06F 3/0433 |
| 2004/0021814 A1 * | 2/2004 | Elman | ............ | G02F 1/133634 |
| | | | | 349/117 |
| 2004/0021815 A1 * | 2/2004 | Elman | ............ | C08G 63/193 |
| | | | | 349/117 |
| 2004/0027520 A1 * | 2/2004 | Elman | ............ | G02F 1/133634 |
| | | | | 349/117 |
| 2004/0027521 A1 * | 2/2004 | Elman | ............ | C08G 63/193 |
| | | | | 349/117 |
| 2004/0034121 A1 * | 2/2004 | Nozaki | ............ | C08K 9/08 |
| | | | | 523/124 |
| 2004/0227879 A1 * | 11/2004 | Elman | ............ | C08G 63/193 |
| | | | | 349/117 |
| 2004/0233174 A1 * | 11/2004 | Robrecht | ............ | G06F 3/0433 |
| | | | | 345/173 |
| 2005/0024561 A1 * | 2/2005 | Elman | ............ | G02B 5/3083 |
| | | | | 349/117 |
| 2005/0266239 A1 * | 12/2005 | Satake | ............ | G02B 5/3083 |
| | | | | 428/354 |
| 2006/0098146 A1 * | 5/2006 | Yano | ............ | G02B 5/3083 |
| | | | | 349/118 |
| 2007/0046857 A1 * | 3/2007 | Murai | ............ | G02F 1/133603 |
| | | | | 349/62 |
| 2007/0087132 A1 * | 4/2007 | Greener | ............ | G02B 5/3083 |
| | | | | 428/1.1 |
| 2007/0254107 A1 * | 11/2007 | Rao | ............ | B82Y 30/00 |
| | | | | 427/372.2 |
| 2007/0259148 A1 * | 11/2007 | Miyako | ............ | C09J 133/02 |
| | | | | 428/40.1 |
| 2008/0024703 A1 * | 1/2008 | Ichihashi | ............ | C09K 19/56 |
| | | | | 349/119 |
| 2008/0026238 A1 * | 1/2008 | Miyako | ............ | C09J 7/0217 |
| | | | | 428/522 |
| 2008/0069993 A1 * | 3/2008 | Kawahara | ............ | B65D 65/466 |
| | | | | 428/36.6 |
| 2008/0266493 A1 * | 10/2008 | Yonezawa | ............ | C08L 25/10 |
| | | | | 349/96 |
| 2009/0040435 A1 * | 2/2009 | Takahashi | ............ | G02B 5/3083 |
| | | | | 349/96 |
| 2009/0040454 A1 | 2/2009 | Ichihashi et al. | | |
| 2009/0081469 A1 * | 3/2009 | Oka | ............ | C08F 2/50 |
| | | | | 428/441 |
| 2009/0082499 A1 * | 3/2009 | Nishida | ............ | C08J 5/18 |
| | | | | 524/195 |
| 2009/0213311 A1 * | 8/2009 | Hisakado | ............ | G02F 1/133634 |
| | | | | 349/117 |
| 2009/0274885 A1 * | 11/2009 | Egawa | ............ | C08L 67/04 |
| | | | | 428/220 |
| 2009/0309616 A1 * | 12/2009 | Klinghult | ............ | G06F 3/044 |
| | | | | 324/686 |
| 2010/0040842 A1 * | 2/2010 | Everaerts | ............ | B32B 37/12 |
| | | | | 428/201 |
| 2010/0062189 A1 * | 3/2010 | Yosomiya | ............ | G02B 1/105 |
| | | | | 428/1.31 |
| 2010/0168363 A1 * | 7/2010 | Ueda | ............ | C08F 8/16 |
| | | | | 526/328.5 |
| 2010/0253892 A1 * | 10/2010 | Higashi | ............ | G02B 5/3083 |
| | | | | 349/118 |
| 2011/0062829 A1 * | 3/2011 | Andoh | ............ | H01L 41/0471 |
| | | | | 310/363 |
| 2011/0069014 A1 * | 3/2011 | Huang | ............ | G06F 3/03547 |
| | | | | 345/173 |
| 2011/0109204 A1 * | 5/2011 | Tajitsu | ............ | H01L 41/193 |
| | | | | 310/348 |
| 2011/0118395 A1 | 5/2011 | Kiuchi et al. | | |
| 2011/0128245 A1 * | 6/2011 | Andoh | ............ | H04R 17/005 |
| | | | | 345/173 |
| 2011/0240918 A1 | 10/2011 | Ootsuki et al. | | |
| 2012/0025674 A1 * | 2/2012 | Yoshida | ............ | C08G 63/08 |
| | | | | 310/365 |
| 2012/0108783 A1 * | 5/2012 | Ando | ............ | H01L 41/193 |
| | | | | 528/272 |
| 2012/0123062 A1 * | 5/2012 | Laufer | ............ | C08G 18/025 |
| | | | | 525/418 |
| 2012/0132846 A1 * | 5/2012 | Yoshida | ............ | H01L 41/45 |
| | | | | 252/62.9 R |
| 2012/0202058 A1 * | 8/2012 | Takahira | ............ | C08G 18/4202 |
| | | | | 428/355 EN |

(56) References Cited

U.S. PATENT DOCUMENTS

| | | | | |
|---|---|---|---|---|
| 2012/0306777 | A1* | 12/2012 | Kang | G06F 3/044 345/173 |
| 2013/0044282 | A1* | 2/2013 | Kuwabara | G02F 1/1333 349/96 |
| 2013/0082970 | A1* | 4/2013 | Frey | G06F 3/0414 345/173 |
| 2013/0108061 | A1* | 5/2013 | Ando | G06F 3/0433 381/55 |
| 2013/0136874 | A1* | 5/2013 | Xia | C09J 4/00 428/1.5 |
| 2013/0223637 | A1* | 8/2013 | Ando | H04R 17/00 381/59 |
| 2014/0049137 | A1* | 2/2014 | Ando | G01B 7/16 310/330 |
| 2014/0051825 | A1* | 2/2014 | Yoshida | H01L 41/45 528/361 |
| 2014/0071353 | A1* | 3/2014 | Nashiki | G02F 1/13338 349/12 |
| 2014/0339724 | A1 | 11/2014 | Yoshida et al. | |
| 2016/0099403 | A1* | 4/2016 | Tanimoto | B32B 27/36 428/336 |
| 2017/0250336 | A1* | 8/2017 | Tanimoto | H01L 41/193 |
| 2018/0101261 | A1* | 4/2018 | Mori | G06F 3/044 |

FOREIGN PATENT DOCUMENTS

| | | | |
|---|---|---|---|
| JP | 5-152638 A | | 6/1993 |
| JP | 09-110968 A | * | 4/1997 |
| JP | 2005-206696 A | | 8/2005 |
| JP | 2005-213376 A | * | 8/2005 |
| JP | 2006-268018 A | | 10/2006 |
| JP | 2007-310105 A | | 11/2007 |
| JP | 2008-013593 A | * | 1/2008 |
| JP | 2009-021408 A | | 1/2009 |
| JP | 2009-192611 A | | 8/2009 |
| JP | 2009-198600 A | * | 9/2009 |
| JP | 2011-074354 A | * | 4/2011 |
| JP | 2011-225520 A | | 11/2011 |
| JP | 2012-056239 A | * | 3/2012 |
| JP | 2012-232497 A | * | 11/2012 |
| KR | 10-2008-0006573 A | | 1/2008 |
| KR | 10-2011-0038102 A | | 4/2011 |
| KR | 10-2012-0058536 A | | 6/2012 |
| WO | WO 2010/143528 A1 | | 12/2010 |
| WO | WO 2011/125408 A | * | 10/2011 |
| WO | WO 2012-026494 A | * | 3/2012 |
| WO | WO 2012-137897 A | * | 10/2012 |

OTHER PUBLICATIONS

Office Action issued by the Korean Patent Office in corresponding Korean Patent Application No. 10-2015-7020321 dated Nov. 29, 2016 (14 pages including partial English translation).

International Search Report (PCT/ISA/210) dated Apr. 15, 2014, by the Japanese Patent Office as the International Searching Authority for International Application No. PCT/JP2014/051850.

* cited by examiner

DISPLAY DEVICE AND LAMINATED OPTICAL FILM

TECHNICAL FIELD

The present invention relates to a display device and a laminated optical film.

BACKGROUND ART

A piezoelectric polymer material using a helical chiral polymer (for example, a polylactic acid polymer) having optical activity has been recently reported.

For example, a piezoelectric polymer material that exhibits a piezoelectric modulus of approximately 10 pC/N at room temperature through stretching of a molded article of polylactic acid is disclosed (see, for example, Japanese Patent Application Laid-Open (JP-A) No. H5-152638).

Moreover, in order to obtain highly oriented polylactic acid crystals, performing a special orientation process referred to as a forging method to achieve a piezoelectricity of approximately 18 pC/N has also been reported (see, for example, JP-A No. 2005-213376).

Meanwhile, a touch panel using a molecularly-oriented polylactic acid film and a touch type input device using this touch panel have been known (see, for example, WO 2010/143528).

In display devices such as a liquid crystal display device and an organic electroluminescence display device, a linear polarizer may be used (see, for example, JP-A Nos. 2006-268018, 2009-192611, and 2009-21408).

DISCLOSURE OF INVENTION

Technical Problem

However, in the display device with the linear polarizer, it is found that when a crystalline piezoelectric polymer layer is used as a component of the display device, the contrast of a displayed image may be lowered.

Accordingly, a problem to be solved by the present invention is to provide a display device in which lowering of the contrast of a displayed image is reduced and a laminated optical film which can reduce the lowering of the contrast of a displayed image when used in the display device.

Solution to Problem

The following are specific measures for achieving the object.

<1> A display device containing:

a crystalline piezoelectric polymer layer containing a helical chiral polymer (A) that has a weight average molecular weight of from 50,000 to 1,000,000 and has optical activity;

an optical compensation layer satisfying the following expression (1):

$$|0.06 \times Xc \times MORc \times d + Rth| \leq 500 \qquad \text{expression (1)}:$$

wherein, in expression (1), Xc represents a degree of crystallinity (%) of the crystalline piezoelectric polymer layer obtained by a DSC method; MORc represents a standardized molecular orientation of the crystalline piezoelectric polymer layer measured by a microwave transmission molecular orientation meter when a reference thickness is 50 µm; d represents a thickness (µm) of the crystalline piezoelectric polymer layer; and Rth represents a phase difference (nm) in a thickness direction of the optical compensation layer at a wavelength of 550 nm; and a linear polarizer.

<2> The display device described in <1>, wherein, in the crystalline piezoelectric polymer layer, the degree of crystallinity is from 20% to 80%, and a product of the standardized molecular orientation and the degree of crystallinity is from 25 to 700.

<3> The display device described in <1> or <2>, wherein there is no linear polarizer between the crystalline piezoelectric polymer layer and the optical compensation layer.

<4> The display device described in any one of <1> to <3>, further containing a liquid crystal cell or an organic electroluminescence element.

<5> The display device described in any one of <1> to <4>, containing a pair of linear polarizers and a liquid crystal cell, wherein the liquid crystal cell, the crystalline piezoelectric polymer layer, and the optical compensation layer are arranged between the pair of linear polarizers.

<6> The display device described in any one of <1> to <4>, containing a pair of linear polarizers and a liquid crystal cell, wherein the liquid crystal cell is disposed between the pair of linear polarizers; and the crystalline piezoelectric polymer layer and the optical compensation layer are arranged closer to a viewing side than the pair of linear polarizers.

According to the display device described in <6>, lowering of the contrast of a displayed image is reduced when the displayed image is observed through a polarizer such as sunglasses.

<7> The display device described in any one of <1> to <4>, further containing an organic electroluminescence element, wherein the crystalline piezoelectric polymer layer and the optical compensation layer are arranged between the linear polarizer and the organic electroluminescence element.

<8> The display device described in any one of <1> to <4>, further containing an organic electroluminescence element, wherein the crystalline piezoelectric polymer layer and the optical compensation layer are arranged closer to a viewing side than the linear polarizer.

According to the display device described in <8>, the lowering of the contrast of a displayed image is reduced when the displayed image is observed through a polarizer such as sunglasses.

<9> The display device described in any one of <1> to <8>, wherein an absorption axis of the linear polarizer and a crystal axis of the crystalline piezoelectric polymer layer are substantially parallel or substantially vertical to each other.

<10> The display device described in any one of <1> to <9>, wherein the optical compensation layer satisfies the following expression (2):

$$|0.06 \times Xc \times MORc \times d + Rth| \leq 250 \qquad \text{expression (2)}:$$

wherein, in expression (2), Xc represents the degree of crystallinity (%) of the crystalline piezoelectric polymer layer; MORc represents the standardized molecular orientation of the crystalline piezoelectric polymer layer; d represents the thickness (µm) of the crystalline piezoelectric polymer layer; and Rth represents the phase difference (nm) in the thickness direction of the optical compensation layer at a wavelength of 550 nm.

<11> The display device described in any one of <1> to <10>, wherein the crystalline piezoelectric polymer layer further contains a stabilizer (B) having one or more of functional groups selected from the group consisting of a carbodiimide group, an epoxy group and an isocyanate group, and having a weight average molecular weight of from 200 to 60,000, and the stabilizer (B) is contained in an amount of from 0.01 part by weight to 10 parts by weight based on 100 parts by weight of the helical chiral polymer (A).

<12> The display device described in <11>, wherein the stabilizer (B) contains a stabilizer (B3) having, in one molecule, one functional group selected from the group consisting of a carbodiimide group, an epoxy group and an isocyanate group.

<13> The display device described in any one of <1> to <12>, wherein the crystalline piezoelectric polymer layer has an internal haze for visible light rays of 50% or less, and a piezoelectric constant $d_{14}$, measured at 25° C. by a displacement method, of 1 pm/V or more.

<14> The display device described in any one of <1> to <13>, wherein the helical chiral polymer (A) is a polylactic acid polymer having a main chain that contains a repeating unit represented by the following formula (1):

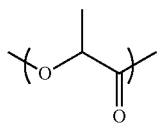

(1)

<15> A laminated optical film containing a crystalline piezoelectric polymer layer containing a helical chiral polymer (A) that has a weight average molecular weight of from 50,000 to 1,000,000 and has optical activity; and an optical compensation layer satisfying the following expression (1):

|0.06×Xc×MORc×d+Rth|≤500    expression (1):

wherein, in expression (1), Xc represents a degree of crystallinity (%) of the crystalline piezoelectric polymer layer obtained by a DSC method; MORc represents a standardized molecular orientation of the crystalline piezoelectric polymer layer measured by a microwave transmission molecular orientation meter when a reference thickness is 50 μm; d represents a thickness (μm) of the crystalline piezoelectric polymer layer; and Rth represents a phase difference (nm) in a thickness direction of the optical compensation layer at a wavelength of 550 nm.

<16> The laminated optical film described in <15>, wherein, in the crystalline piezoelectric polymer layer, the degree of crystallinity is from 20% to 80%, and a product of the standardized molecular orientation and the degree of crystallinity is from 25 to 700.

<17> The laminated optical film described in <15> or <16>, wherein the crystalline piezoelectric polymer layer further contains a stabilizer (B) having one or more of functional groups selected from the group consisting of a carbodiimide group, an epoxy group and an isocyanate group, and having a weight average molecular weight of from 200 to 60,000, and the stabilizer (B) is contained in an amount of from 0.01 part by weight to 10 parts by weight based on 100 parts by weight of the helical chiral polymer (A).

<18> The laminated optical film described in <17>, wherein the stabilizer (B) contains a stabilizer (B3) having, in one molecule, one functional group selected from the group consisting of a carbodiimide group, an epoxy group and an isocyanate group.

<19> The laminated optical film described in any one of <15> to <18>, wherein the crystalline piezoelectric polymer layer has an internal haze for visible light rays of 50% or less, and a piezoelectric constant $d_{14}$, measured at 25° C. by a displacement method, of 1 pm/V or more.

<20> The laminated optical film described in any one of <15> to <19>, wherein the helical chiral polymer (A) is a polylactic acid polymer having a main chain that contains a repeating unit represented by the following formula (1):

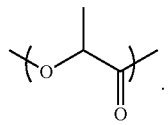

(1)

Advantageous Effects of Invention

The present invention can provide a display device in which lowering of the contrast of a displayed image is reduced and a laminated optical film which can reduce the lowering of the contrast of a displayed image when used in the display device.

DESCRIPTION OF EMBODIMENTS

Figure 1:
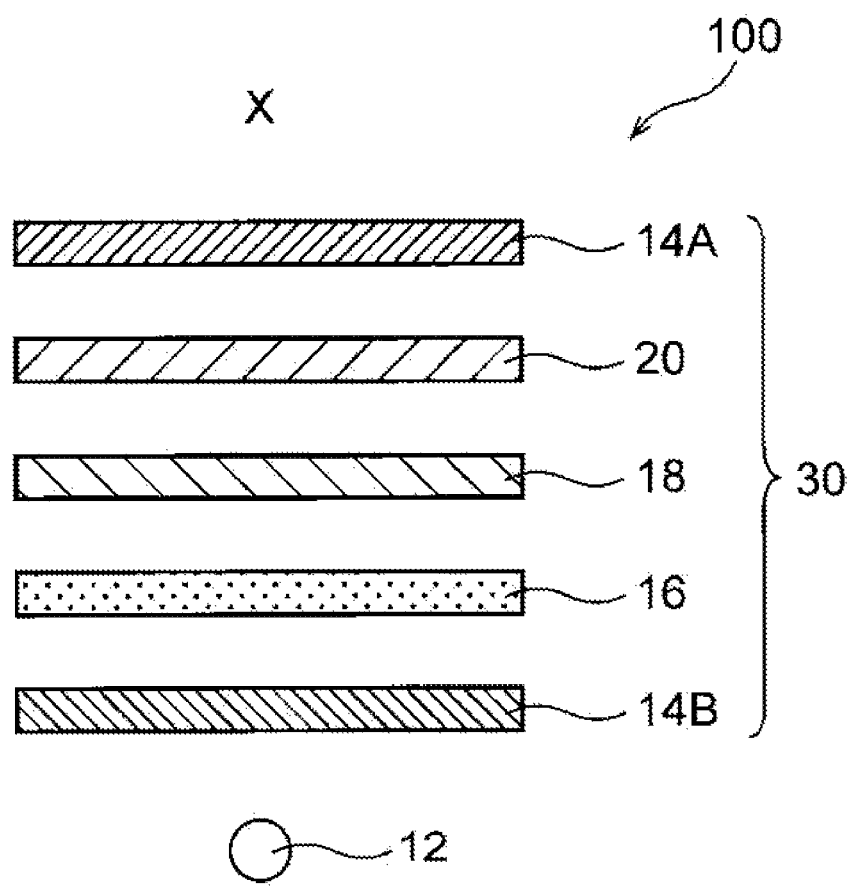
FIG. 1 is a schematic exploded side view showing a liquid crystal display device as an example of a display device of a first embodiment.

Hereinafter, a display device and a laminated optical film of the present invention will be described in detail.

The display device contains a crystalline piezoelectric polymer layer having a helical chiral polymer (A) that has a weight average molecular weight of from 50,000 to 1,000,000 and has optical activity, an optical compensation layer satisfying the following expression (1), and a linear polarizer.

Also, the laminated optical film of the invention includes the crystalline piezoelectric polymer layer and the optical compensation layer.

Hereinafter, the term "piezoelectric polymer layer" means a crystalline piezoelectric polymer layer.

|0.06×Xc×MORc×d+Rth|≤500    Expression (1):

In expression (1), Xc represents a degree of crystallinity (%) of the crystalline piezoelectric polymer layer obtained by a DSC method; MORc represents a standardized molecular orientation of the crystalline piezoelectric polymer layer measured by a microwave transmission molecular orientation meter when a reference thickness is 50 μm; d represents a thickness (μm) of the crystalline piezoelectric polymer layer; and Rth represents a phase difference (nm) in a thickness direction of the optical compensation layer at a wavelength of 550 nm.

According to the studies made by the present inventors, it has been found that when the above crystalline piezoelectric polymer layer is used as a component of a display device with the linear polarizer, the contrast of a displayed image may be reduced.

The reason for lowering of the contrast of a displayed image is assumed as follows.

Namely, in the above piezoelectric polymer layer, there is a tendency that the larger a product of Xc and MORc (for example, the higher the molecular orientation of the helical chiral polymer (A)), the better the piezoelectric performance. At the same time, a coarse and dense structure including a relatively high crystalline portion and a relatively low crystalline portion is produced in the crystalline piezoelectric polymer layer, and it is considered that there is a tendency that this structure greatly influences on the refractive index of light passing through the crystalline piezoelectric polymer layer. Thus, when the above piezoelectric polymer layer is used as a component of a display device with a linear polarizer, the above-described crystal structure of the piezoelectric polymer layer causes light leakage through the linear polarizer, and it is considered that the light leakage may cause lowering of the contrast of a displayed image.

In this regard, the present inventors have found that a combination of the above-described crystalline piezoelectric polymer layer and an optical compensation layer satisfying the expression (1) reduces the lowering of the contrast of a displayed image and completed the present invention.

In the display device of the present invention, arrangement of the piezoelectric polymer layer (that is, the crystalline piezoelectric polymer layer, the same applies to the following), the optical compensation layer, and the linear polarizer is not limited particularly.

For example, in the display device of the present invention, in an embodiment in which the piezoelectric polymer layer and the optical compensation layer are arranged closer to a non-viewing side (that is, the side opposite to a viewing side, the same applies to the following) than the linear polarizer (namely, in an embodiment in which the linear polarizer is located on the viewing side, for example, the first and third embodiments to be described later), the lowering of the contrast of a displayed image due to the light leakage through the linear polarizer is reduced.

Specifically, when the optical compensation layer is removed from the display device in this embodiment, light to be normally blocked by the linear polarizer leaks, and this causes reduction in the contrast of a displayed image.

In the display device of the present invention, in an embodiment in which the piezoelectric polymer layer and the optical compensation layer are arranged closer to the viewing side than the linear polarizer (for example, the second and fourth embodiments to be described later), the lowering of the contrast of a displayed image is reduced when the displayed image is observed through a polarizer such as sunglasses.

Specifically, the optical compensation layer is removed from the display device in this embodiment, and when the displayed image is observed through the polarizer such as sunglasses, a polarization state of light passing through the linear polarizer of the display device is changed by the piezoelectric polymer layer, and this causes the lowering of the contrast of the displayed image.

In expression (1), the left-hand side "$|0.06 \times Xc \times MORc \times d+Rth|$" is an absolute value of "$0.06 \times Xc \times MORc \times d+Rth$" and is 500 or less as shown in expression (1).

When the left-hand side exceeds 500, the contrast of a displayed image is lowered.

The left-hand side is preferably 400 or less, more preferably 300 or less, and particularly preferably 250 or less.

The fact that the left-hand side is 250 or less means that the following expression (2) is satisfied.

$|0.06 \times Xc \times MORc \times d+Rth| \leq 250$   Expression (2):

In expression (2), Xc, MORc, d, and Rth have the same definitions as Xc, MORc, d, and Rth in the expression (1), respectively.

The display device of the present invention is not limited particularly, except for the above configuration, and configurations of well-known display devices can be suitably selected.

For example, in a case in which the above-mentioned piezoelectric polymer layer is additionally provided in the well-known display device, and when the display device is constituted of a component satisfying the expression (1), the component may be used as the optical compensation layer (namely, the optical compensation layer may not be provided separately from this component).

It is preferable that the display device of the present invention has a display part (an image display part) in addition to the piezoelectric polymer layer, the optical compensation layer, and the linear polarizer.

Examples of the display part include a liquid crystal cell and an organic electroluminescence (hereinafter also referred to as "organic EL") element.

In the display device of the present invention, although the arrangement of the piezoelectric polymer layer, the optical compensation layer, and the linear polarizer is not limited particularly, it is preferable that the linear polarizer is not located between the piezoelectric polymer layer and the optical compensation layer.

According to this constitution, a phenomenon in which light before compensation enters the linear polarizer is prevented, so that the lowering of the contrast of a displayed image can be further reduced.

In the display device of the present invention, in terms of further reducing the lowering of the contrast of a displayed image, it is preferable that an absorption axis of the linear polarizer and a crystal axis of the piezoelectric polymer layer are substantially parallel or substantially vertical to each other.

The term, substantially parallel, means that when an angle formed by those two axes is represented in the range of from 0° to 90°, the angle is from 0° to 3° (preferably, from 0° to 1°). On the other hand, the term, substantially vertical, means that when an angle formed by those two axes is represented in the range of from 0° to 90°, the angle is from 87° to 90° (preferably, from 89° to 90°).

Further, the crystal axis of the piezoelectric polymer layer means an axis parallel to a main orientation direction of the molecular chain of the helical chiral polymer (A). The main orientation direction of the molecular chain of the helical chiral polymer (A) specifically means a direction in which the highest anisotropy is exhibited when the standardized molecular orientation MORc is measured. For example, when the piezoelectric polymer layer is obtained by stretching, the direction of the crystal axis of the piezoelectric polymer layer is substantially equal to the main stretching direction in the stretching. In particular, when the piezoelectric polymer layer is obtained by uniaxial stretching, the crystal axis of the piezoelectric polymer layer is substantially equal to the uniaxial stretching direction.

Hereinafter, the display devices according to the first to fourth embodiments of the present invention will be described with suitably referring to the drawings. However, the invention is not limited to the following embodiments. The same reference numerals are assigned to components having the substantially same functions through all the drawings, and description thereof may be omitted.

<First Embodiment>

A display device (that is, a liquid crystal display device) according to the first embodiment has a pair of linear polarizers and a liquid crystal cell, the piezoelectric polymer layer, and the optical compensation layer arranged between the pair of linear polarizers.

In the first embodiment, a liquid crystal panel including the pair of linear polarizers and the liquid crystal cell disposed between the pair of linear polarizers includes the piezoelectric polymer layer and the optical compensation layer.

FIG. 1 is a schematic exploded side view showing a liquid crystal display device 100 as an example of the display device of the first embodiment.

As shown in FIG. 1, the liquid crystal display device 100 has a liquid crystal panel 30 including a polarizing plate 14A as a linear polarizer, an optical compensation layer 20 as an example of the optical compensation layer in the present invention, a piezoelectric polymer layer 18 as an example of the piezoelectric polymer layer in the present invention, a liquid crystal cell 16, and a polarizing plate 14B as a linear polarizer, and these components are arranged in this sequence as viewed from a viewing side X. The liquid crystal display device 100 further includes a light source 12 (for example, a backlight) on a non-viewing side (opposite to the viewing side X) as viewed from the liquid crystal panel 30. Here, the polarizing plate 14A on the viewing side is sometimes referred to as an "upper polarizing plate", and the polarizing plate 14B on the non-viewing side (light source side) is sometimes referred to as a "lower polarizing plate".

The liquid crystal cell 16 may have a well-known configuration in which liquid crystal molecules are arranged between a pair of substrates (for example, between a substrate with a thin-film transistor (TFT) and a counter substrate such as a color filter substrate or a monochrome filter substrate), for example. Examples of a mode of a liquid crystal display device include a TN (Twisted Nematic) mode, an STN (Super Twisted Nematic) mode, an IPS (In-Plane Switching) mode, a VA (Vertical Alignment) mode, and an OCB (Optically Compensated Bend) mode.

The piezoelectric polymer layer 18 and the optical compensation layer 20 will be described later in detail.

Since the liquid crystal display device 100 has the optical compensation layer 20, when a displayed image on the liquid crystal panel 30 is observed from the viewing side X, lowering of the contrast of the displayed image considered due to a crystal structure of the piezoelectric polymer layer 18 is reduced.

Namely, in a case in which the optical compensation layer 20 is removed from the liquid crystal display device 100, and when the displayed image on the liquid crystal panel 30 is observed from the viewing side X, light to be normally blocked by the polarizing plate 14A leaks (particularly during black display or halftone display), and this causes reduction in the contrast of the displayed image.

In the liquid crystal display device 100, at least two of the constituent members may be adhered with an adhesive or the like.

In the manufacturing of the liquid crystal display device 100, a laminated optical film including the piezoelectric polymer layer 18 and the optical compensation layer 20 is previously provided, and the liquid crystal display device 100 may be manufactured using the provided laminated optical film.

Examples of an adhesive for adhering the members include an acrylic resin, an urethane resin, a cellulosic adhesive, a vinyl acetate resin, an ethylene-vinyl acetate resin, an epoxy resin, a nylon epoxy-based adhesive, a vinyl chloride resin, a chloroprene rubber resin, a cyanoacrylate adhesive, a silicone-based adhesive, a modified silicone-based adhesive, an aqueous polymer-isocyanate based adhesive, a styrene-butadiene rubber-based adhesive, a nitrile rubber-based adhesive, an acetal resin, a phenolic resin, a polyamide resin, a polyimid resin, a melamine resin, a urea resin, a bromine resin, a starch-based adhesive, a polyester resin, and a polyolefin resin.

The liquid crystal display device 100 may have constituent members of a well-known liquid crystal display device. In other respects, the liquid crystal display device 100 has a configuration similar to the configuration of the well-known liquid crystal display device.

The variations of the liquid crystal display device 100 are as follows.

As a variation of the liquid crystal display device 100, the optical compensation layer 20 and the piezoelectric polymer layer 18 may be located between the liquid crystal cell 16 and the polarizing plate 14B on the light source 12 side, instead of between the polarizing plate 14A on the viewing side X and the liquid crystal cell 16.

As another variation of the liquid crystal display device 100, the places of the optical compensation layer 20 and the piezoelectric polymer layer 18 may be exchanged.

As still another variation of the liquid crystal display device 100, the liquid crystal display device 100 may be a reflective liquid crystal display device in which the light source 12 is omitted, and a reflecting electrode is provided in the liquid crystal cell 16 (in addition, the polarizing plate 14B is possibly omitted).

Those variations may be appropriately combined.

<Second Embodiment>

A display device (that is, a liquid crystal display device) according to the second embodiment has a pair of linear polarizers, a liquid crystal cell disposed between the pair of linear polarizers, and the piezoelectric polymer layer and the optical compensation layer arranged closer to the viewing side than the pair of linear polarizers.

In the second embodiment, a liquid crystal panel including a pair of linear polarizers and a liquid crystal cell disposed between the pair of linear polarizers does not include the piezoelectric polymer layer and the optical compensation layer, and the piezoelectric polymer layer and the optical compensation layer are arranged outside (on the viewing side of) the liquid crystal panel.

Figure 2:
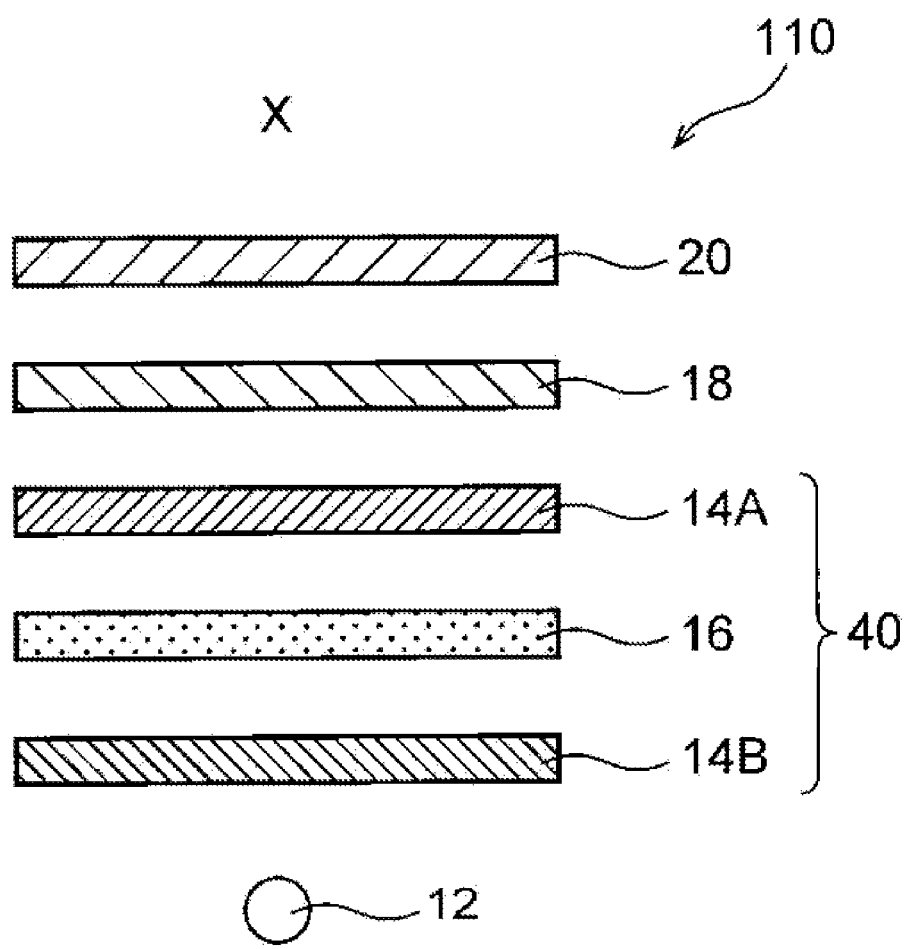
FIG. 2 is a schematic exploded side view showing a liquid crystal display device as an example of a display device of a second embodiment.

FIG. 2 is a schematic exploded side view showing a liquid crystal display device 110 as an example of the display device of the second embodiment.

As shown in FIG. 2, the liquid crystal display device 110 has a configuration similar to the configuration of the liquid crystal display device 100 (FIG. 1), except that the liquid crystal panel does not include the optical compensation layer 20 and the piezoelectric polymer layer 18, and the optical compensation layer 20 and the piezoelectric polymer layer 18 are arranged closer to the viewing side than the liquid crystal panel (this also applies to preferred embodiments and variations).

In the liquid crystal display device 110, when a displayed image on a liquid crystal panel 40 is observed from the viewing side X through a polarizer such as sunglasses, lowering of the contrast of the displayed image is reduced.

Namely, in a case in which the optical compensation layer 20 is removed from the liquid crystal display device 110, and when the displayed image on the liquid crystal panel 40 is observed from the viewing side X through the polarizer such as sunglasses, a polarization state of light passing through a linear polarizer of the display device is changed by the piezoelectric polymer layer 18 (particularly during black display or halftone display), and this causes the lowering of the contrast of the displayed image.

The principle of the reduction in lowering of the contrast in the liquid crystal display device 110 is similar to the principle of the reduction in lowering of the contrast in the liquid crystal display device 100. Namely, the polarizing plate 14A in the liquid crystal display device 100 corresponds to the polarizer such as sunglasses in the liquid crystal display device 110.

<Third Embodiment>

A display device (that is, an organic EL display device) according to the third embodiment has an organic EL element, and the piezoelectric polymer layer and the optical compensation layer are arranged between the linear polarizer and the organic EL element.

According to the display device according to the third embodiment, the principle similar to the principle in the display device according to the first embodiment reduces lowering of the contrast of a displayed image due to a crystal structure of the piezoelectric polymer layer.

In the display device (organic EL display device) according to the third embodiment, the configurations other than the above configuration may be suitably referred to from configurations of well-known organic EL display devices (for example, the organic EL display device described in JP-A No. 2009-21408).

Figure 3:
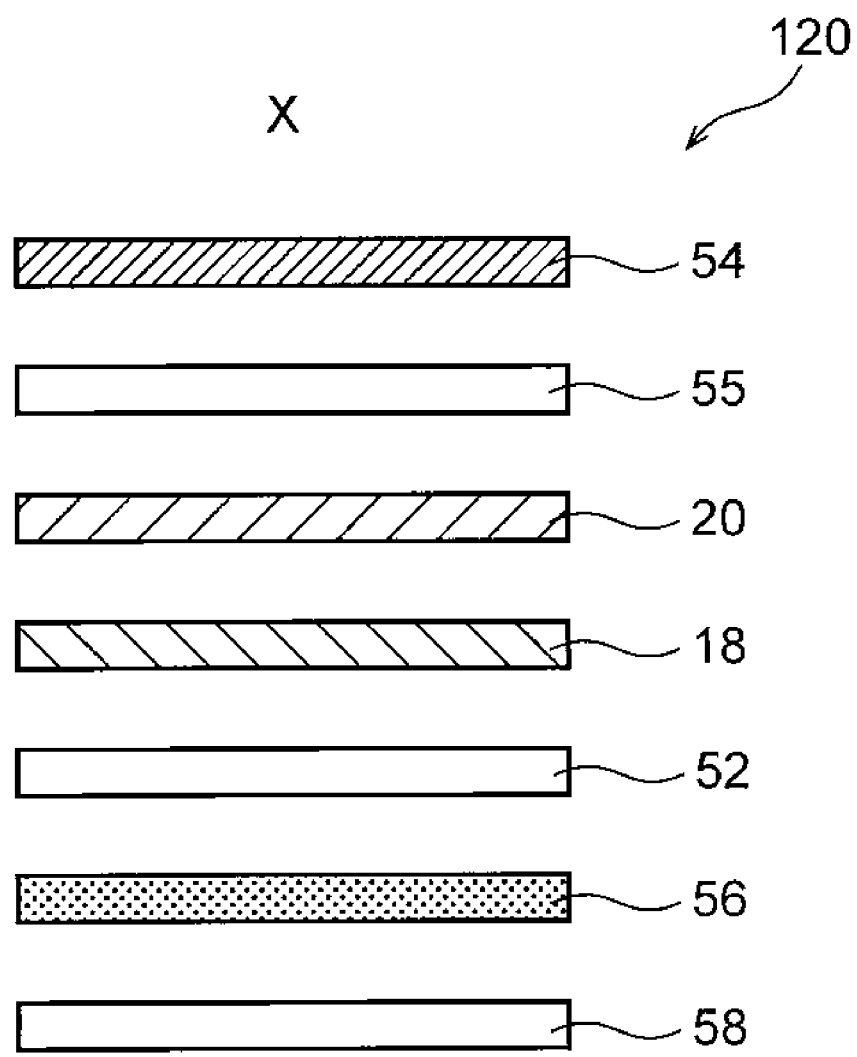
FIG. 3 is a schematic exploded side view showing an organic EL display device as an example of a display device of a third embodiment.

FIG. 3 is a schematic exploded side view showing an organic EL display device 120 as an example of the display device of the third embodiment.

The organic EL display device 120 is configured so that a polarizing plate 54 as a linear polarizer, a ¼ wavelength plate 55, an optical compensation layer 20 as an example of the optical compensation layer according to the present invention, a piezoelectric polymer layer 18 as an example of the piezoelectric polymer layer according to the invention, an upper ITO transparent electrode 52, an organic EL element layer 56, and a metal reflective electrode 58 are arranged as viewed from a viewing side X.

In this example, a laminate of the polarizing plate 54 and the ¼ wavelength plate 55 functions as a circularly polarizing plate and reduces external light reflection. In this case, as in the liquid crystal display device 100, the lowering of the contrast of a displayed image due to the crystal structure of the piezoelectric polymer layer 18 is reduced by the provision of the optical compensation layer 20.

<Fourth Embodiment>

A display device (that is, an organic EL display device) according to the fourth embodiment has an organic EL element, and the piezoelectric polymer layer and the optical compensation layer are arranged closer to a viewing side than the linear polarizer.

According to the display device (organic EL display device) according to the fourth embodiment, the principle similar to the principle in the display device according to the second embodiment reduces lowering of the contrast of a displayed image due to a crystal structure of the piezoelectric polymer layer when the displayed image is observed from the viewing side through a polarizer such as sunglasses.

In the display device (organic EL display device) according to the fourth embodiment, the configurations other than the above configuration may be suitably referred to from configurations of well-known organic EL display devices (for example, the organic EL display device described in JP-A No. 2009-21408).

Figure 4:
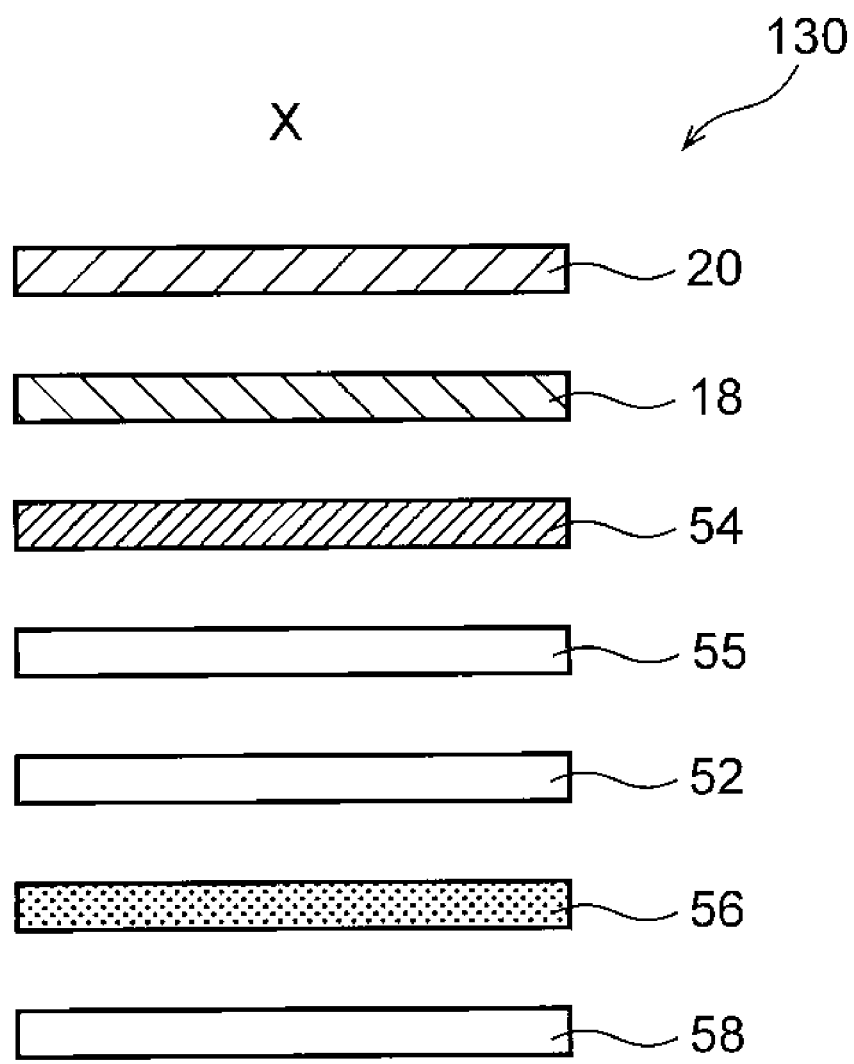
FIG. 4 is a schematic exploded side view showing an organic EL display device as an example of a display device of a fourth embodiment.

FIG. 4 is a schematic exploded side view showing an organic EL display device 130 as an example of the display device of the fourth embodiment.

As shown in FIG. 4, the organic EL display device 130 is configured similar to the organic EL display device 120 (FIG. 3), except that the optical compensation layer 20 and the piezoelectric polymer layer 18 are arranged closer to the viewing side than the polarizing plate 54, unlike the organic EL display device 120.

In this example, a laminate of the polarizing plate 54 and the ¼ wavelength plate 55 functions as a circularly polarizing plate and reduces external light reflection. In this case, as in the liquid crystal display device 110, the lowering of the contrast of a displayed image due to the crystal structure of the piezoelectric polymer layer 18 is reduced by the provision of the optical compensation layer 20 when the displayed image is observed through a polarizer such as sunglasses.

Hereinabove, although the first to fourth embodiments of the display device of the present invention have been described, this invention is not limited to these embodiments.

For example, in the display device of each embodiment, electrodes having optical transparency may be provided on both surfaces (both principal surfaces) of the piezoelectric polymer layer. Namely, each display device may be provided with a piezoelectric device (for example, a touch panel) in which the electrodes having optical transparency are provided on the both surfaces of the piezoelectric polymer layer.

Here, the "principal surface" means a surface having the largest area among surfaces of the piezoelectric polymer layer.

As the above electrode, the electrode having optical transparency is preferably used, and ITO, ZnO, IZO (trademark), or conductive polymer may be used, for example. As the above electrode, an electrode having an internal haze of 50% or less (total light transmittance is 50% or more) is preferably used.

When the display device is provided with the piezoelectric device, although an electrode exists between the piezoelectric polymer layer and the optical compensation layer, this embodiment also reduces the lowering of the contrast of the displayed image due to the crystal structure of the piezoelectric polymer layer by providing the optical compensation layer.

As the configuration of the electrode of the piezoelectric device (for example, a touch panel), there can be appropriately referred a configuration of an electrode described in, for example, WO 2010/143528 in which the electrodes are formed on a first principal surface and a second principal surface of a polylactic acid film.

In each display device, a laminated piezoelectric device obtained by repeatedly superposing piezoelectric polymer layers and electrodes may be used instead of the piezoelectric polymer layer. In this embodiment, at least one of a plurality of the piezoelectric polymer layers is the piezoelectric polymer layer according to the present invention.

This embodiment also reduces the lowering of the contrast of a displayed image by providing the optical compensation layer.

Examples of such a laminated piezoelectric device include a device in which a unit including an electrode and a piezoelectric polymer layer is repeatedly superposed, and a principal surface of the piezoelectric polymer layer which is not covered with the electrode is finally covered with the electrode. Specifically, when the unit is superposed twice, a laminated piezoelectric element in which the electrode, the piezoelectric polymer layer, the electrode, the piezoelectric polymer layer, and the electrode are superposed in this order is obtained. One of the piezoelectric polymer layers used in the laminated piezoelectric element may be the piezoelectric polymer layer according to the invention, and the other piezoelectric polymer layers may not be the piezoelectric polymer layer according to the invention.

When the laminated piezoelectric device includes a plurality of the piezoelectric polymer layers according to the invention, if the optical activity of an optically active polymer contained in one layer of the piezoelectric polymer layer according to the invention is an L-isomer, the optically active polymers contained in the other layers of the piezoelectric polymer layers may be L-isomers or D-isomers. The arrangement of the piezoelectric polymer layers may be suitably adjusted depending on the application.

For example, in laminating a first piezoelectric polymer layer mainly composed of an L-isomer of an optically active polymer with a second piezoelectric polymer layer mainly composed of an L-isomer of an optically active polymer via an electrode, when a uniaxial stretching direction (main stretching direction) of the first piezoelectric polymer layer crosses with or is preferably perpendicular to a uniaxial stretching direction (main stretching direction) of the second piezoelectric polymer layer, the directions of displacement of the first piezoelectric polymer layer and the second piezoelectric polymer layer can be set to be equal, so that the piezoelectricity of the entire laminated piezoelectric element is improved, and thus it is preferable.

Meanwhile, in laminating a first piezoelectric polymer layer mainly composed of an L-isomer of an optically active polymer with a second piezoelectric polymer layer mainly composed of a D-isomer of an optically active polymer via an electrode, when a uniaxial stretching direction (main stretching direction) of the first piezoelectric polymer layer is substantially parallel to a uniaxial stretching direction (main stretching direction) of the second piezoelectric polymer layer, the directions of displacement of the first piezoelectric polymer layer and the second piezoelectric polymer layer can be set to be equal, so that the piezoelectricity of the entire laminated piezoelectric element is improved, and thus it is preferable.

Here, the "optically active polymer" means a helical chiral polymer (A) having a weight average molecular weight of from 50,000 to 1,000,000 and having optical activity (the same is applied to the following description).

In the display device of the present invention, the first embodiment and the second embodiment may be combined, or the third embodiment and the fourth embodiment may be combined.

Hereinafter, the piezoelectric polymer layer (for example, the piezoelectric polymer layer 18), the optical compensation layer (for example, the optical compensation layer 20), and the linear polarizer (for example, the polarizing plates 14A, 14B, and 54) according to the present invention will be described.

<Piezoelectric Polymer Layer>

A display device and a laminated optical film of the present invention has at least one piezoelectric polymer layer (for example, the piezoelectric polymer layer 18) containing a helical chiral polymer (A) having a weight average molecular weight of from 50,000 to 1,000,000 and having optical activity.

The piezoelectric polymer layer configured as above has excellent piezoelectricity (that is, a large piezoelectric constant $d_{14}$) and excellent transparency.

Here, the piezoelectric constant refers to one of the piezoelectric modulus tensors and is determined from the degree of polarization produced in the direction of a shearing stress, when the shearing stress is applied along the stretching axis direction of a stretched material. The piezoelectric constant is as described in paragraphs 0013 to 0014 of Japanese Patent No. 4934235.

In the piezoelectric polymer layer according to the present invention, it is preferable that the piezoelectric constant $d_{14}$ measured at 25° C. by a displacement method is 1 pm/V or more. In the piezoelectric polymer layer according to this invention, it is more preferable that the internal haze for visible light rays is 50% or less, and the piezoelectric constant $d_{14}$ measured at 25° C. by the displacement method is 1 pm/V or more.

[Piezoelectric Constant (Displacement Method)]

In the present invention, the "piezoelectric constant $d_{14}$ measured by the displacement method" means a value obtained as follows. Namely, a sine wave alternating voltage of 10 Hz and 300 Vpp is applied to between a pair of conductive layers of a sample for piezoelectric constant measurement obtained by forming the conductive layers on both surfaces of a piezoelectric polymer layer of 32 mm×5 mm, and a difference in distance between the maximal and minimum values of the displacement at this time is measured as a displacement (mp–p). A value obtained by dividing the measured displacement (mp–p) by a reference length of 30 mm is used as an amount of deformation, and a value obtained by multiplying a value, obtained by dividing the amount of deformation by an electric field strength ((applied voltage (V))/(film thickness)) applied to the film, by 2 is used as the piezoelectric constant $d_{14}$ measured by the displacement method.

The "piezoelectric constant $d_{14}$ measured by the displacement method" can be measured by the method described in paragraphs 0058 to 0059 of Japanese Patent No. 4934235.

The higher the piezoelectric constant, the greater the displacement of the material based on a voltage applied to the piezoelectric polymer layer or, in other words, the greater the generated voltage based on force applied to the piezoelectric polymer layer are, so that it is useful as the piezoelectric polymer layer.

Specifically, the piezoelectric constant $d_{14}$ measured by the displacement method at 25° C. is preferably 1 pm/V or more, more preferably 3 pm/V or more, and still more preferably 4 pm/V or more. The upper limit of the piezoelectric constant is not limited particularly but is preferably 50 pm/V or less and more preferably 30 pm/V or less in the piezoelectric material using the helical chiral polymer from the viewpoint of a balance with transparency and the like as described below.

The piezoelectric constant $d_{14}$ measured by a resonance method is preferably 15 pC/N or less from the viewpoint of a balance with transparency and the like.

[Structure]

In the piezoelectric polymer layer according to the present invention, the optically active polymer is oriented.

A "molecular orientation ratio MOR" is an index that indicates the orientation.

The MOR (Molecular Orientation Ratio) is a value that indicates the degree of orientation of molecules and is measured by a microwave measuring method as described below. Namely, a sample (film) is placed in the microwave resonance waveguide of a known apparatus for measuring a microwave molecular orientation ratio (also referred to as a microwave transmission molecular orientation meter), in such a manner that a plane of the sample (film plane) is perpendicular to a direction in which microwaves travel. Then, while the sample is continuously irradiated with microwaves whose oscillation is in one direction, the sample is rotated at from 0 to 360° in a plane perpendicular to the direction in which microwaves travel, and the MOR is calculated by measuring the intensity of microwaves that had penetrated the sample.

The standardized molecular orientation MORc in the present invention is a value of MOR obtained at a reference thickness tc of 50 μm, and can be determined by the following expression:

$$MORc = (tc/t) \times (MOR-1) + 1$$

(tc: reference thickness to be compensated; t: sample thickness)

The standardized molecular orientation MORc may be measured at a resonance frequency of around 4 GHz or 12 GHz by a known molecular orientation meter, such as a microwave molecular orientation meter MOA-2012A or MOA-6000, manufactured by Oji Scientific Instruments.

The standardized molecular orientation MORc may be controlled by regulating the crystallization conditions (for example, heating temperature and heating time) in the production of the piezoelectric polymer layer and stretching conditions (for example, stretching temperature and stretching speed).

The standardized molecular orientation MORc has correlation with a birefringence Δn obtained by diving a phase difference (retardation) by a thickness of the piezoelectric polymer layer.

Specifically, the retardation can be measured by RETS 100 manufactured by Otsuka Electronics Co., Ltd. MORc and Δn are approximately in a linearly proportional relationship, and when Δn is 0, MORc is 1.

[Degree of Crystallinity (Xc)]

The degree of crystallinity (Xc) of the piezoelectric polymer layer is obtained by a DSC (Differential scanning calorimetry) method, and the degree of crystallinity of the piezoelectric polymer layer according to the present invention is preferably from 20% to 80%, and more preferably from 30% to 70%. When the degree of crystallinity is in the range, a balance between the piezoelectricity and transparency of the piezoelectric polymer layer is good, and whitening and breaking are less likely to occur to facilitate its production when the piezoelectric polymer layer is stretched.

Specifically, when the degree of crystallinity is 20% or more, the piezoelectricity tends to be improved.

Meanwhile, when the degree of crystallinity is 80% or less, the transparency tends to increase.

In the present invention, the degree of crystallinity of the piezoelectric polymer layer can be regulated in the range of from 20% to 80% by, for example, regulating the conditions of crystallization and stretching in the production of the piezoelectric polymer layer.

[Transparency (Internal Haze)]

The transparency of the piezoelectric polymer layer may be evaluated by, for example, visual observation or haze measurement.

In the piezoelectric polymer layer, the internal haze for visible light rays is preferably 50% or less. Here, the internal haze is a value obtained by measurement in the piezoelectric polymer layer with a thickness of 0.03 mm to 0.07 mm at 25° C. using a haze measuring machine [manufactured by Tokyo Denshoku Co., Ltd.; TC-HIII DPK] in conformity with JIS-K7105, and the details of the measuring method are described in Examples.

The internal haze of the piezoelectric polymer layer is more preferably 20% or less, still more preferably 5% or less, even more preferably 3.0% or less, further more preferably 2.0% or less, and particularly preferably 1.0% or less.

The internal haze of the piezoelectric polymer layer, which is preferably lower, is preferably from 0.0% to 50%, more preferably from 0.01% to 20%, still more preferably from 0.01% to 5%, even more preferably from 0.01% to 3.0%, further more preferably from 0.01% to 2.0%, and particularly preferably from 0.01% to 1.0% from the viewpoint of a balance with the piezoelectric constant and the like.

The "internal haze" in accordance with the present application refers to the internal haze of the piezoelectric polymer layer according to the present invention. The internal haze is a haze excluding a haze due to the shape of the external surface of the piezoelectric polymer layer as described in Examples below.

[Standardized Molecular Orientation MORc]

In the piezoelectric polymer layer according to the present invention, the standardized molecular orientation MORc is preferably from 1.0 to 15.0 and more preferably from 4.0 to 10.0.

When the degree of the standardized molecular orientation MORc is large, more specifically, when the standardized molecular orientation MORc is 1.0 or more, many molecular chains (for example, polylactic acid molecular chains) of the optically active polymer are aligned in the stretching direction, so that a higher rate of generation of oriented crystals can be attained to exhibit higher piezoelectricity.

[Product of Standardized Molecular Orientation MORc and Degree of Crystallinity]

In the present invention, a product of the degree of crystallinity and the standardized molecular orientation MORc of a piezoelectric polymer layer is preferably from 25 to 700. When the product is regulated within the range, high piezoelectricity and high transparency are maintained.

When the product of the degree of crystallinity and the standardized molecular orientation MORc of the piezoelectric polymer layer is 25 or more, the piezoelectricity tends to increase.

When the product of the degree of crystallinity and the standardized molecular orientation MORc of the piezoelectric polymer layer is 700 or less, the transparency tends to increase.

The product of the degree of crystallinity and MORc is preferably from 40 to 700, more preferably from 75 to 680, still more preferably from 90 to 660, even more preferably from 125 to 650, and further more preferably from 180 to 350. When the product of the degree of crystallinity and MORc falls within the range of from 40 to 700, the balance between the piezoelectricity and the transparency is better, and dimensional stability is better.

In the present invention, the product of the degree of crystallinity and the standardized molecular orientation MORc of a piezoelectric polymer layer can be regulated by, for example, regulating conditions for crystallization and stretching in producing the piezoelectric polymer layer.

In the piezoelectric polymer layer according to the present invention, it is particularly preferable that the degree of crystallinity is from 20% to 80%, and the product of the degree of crystallinity and the standardized molecular orientation MORc is from 25 to 700. The more preferable ranges of the degree of crystallinity and MORc are described as above.

[Thickness (d)]

Although the thickness (d) of the piezoelectric polymer layer is not limited particularly, the thickness (d) may be from 10 μm to 100 μm, for example, and is preferably from 20 μm to 90 μm and more preferably from 30 μm to 80 μm.

[Dimensional Stability]

It is preferable that the dimensional change rate of a piezoelectric polymer layer is low under heat, particularly at a temperature of an environment where the piezoelectric polymer layer is incorporated in a piezoelectric device such as a touch panel, equipment, or the like when used.

This is because when the dimension of the piezoelectric polymer layer changes under a usage environment of a piezoelectric device or the like, positions of wiring and so on connected with the piezoelectric device are moved, and this may cause malfunction of the device. The dimensional stability of the piezoelectric polymer layer is evaluated by the dimensional change rate before and after heat treatment for 10 minutes at a temperature of 150° C. that is slightly higher than a temperature of the usage environment of the piezoelectric device or the like. The dimensional change rate is preferably 10% or less and more preferably 5% or less.

Next, components of the piezoelectric polymer layer according to the present invention will be described.

[Helical Chiral Polymer (A) Having Optical Activity]

The piezoelectric polymer layer according to the present invention contains at least one kind of a helical chiral polymer (A) having a weight average molecular weight of from 50,000 to 1,000,000 and having optical activity.

In the present invention, the helical chiral polymer having optical activity refers to a polymer having a spiral molecular structure and molecular optical activity.

In this specification, the helical chiral polymer (A) having a weight average molecular weight of from 50,000 to 1,000,000 and having optical activity is also referred to as an "optically active polymer (A)" or simply as "optically active polymer".

Examples of the optically active polymer include polypeptides, cellulose, cellulose derivatives, polylactic acid polymers, polypropylene oxides, and poly(β-hydroxy butyric acid). Examples of the polypeptide include poly(γ-benzyl glutaric acid) and poly(γ-methyl glutaric acid). Examples of the cellulose derivative include cellulose acetate and cyanoethyl cellulose.

The optically active polymer preferably has an optical purity of 95.00% ee or more, more preferably 99.00% ee or more, and still more preferably 99.99% ee or more, from the viewpoint of improving the piezoelectricity of the piezoelectric polymer layer. The optical purity is desirably 100.00% ee. It is considered that by adjusting the optical purity of the optically active polymer to be in the range mentioned above, a packing property of polymer crystals that demonstrate piezoelectricity is increased, whereby the piezoelectricity is increased.

In the present invention, the optical purity of the optically active polymer is a value calculated by the following equation.

Optical purity(% ee)=100×|L isomer amount−D isomer amount|/(L isomer amount+D isomer amount)

More specifically, the optical purity is defined as a value obtained by dividing the difference (absolute value) between the L isomer amount [% by mass] of the optically active polymer and the D isomer amount [% by mass] of the optically active polymer by the total of the L isomer amount [% by mass] of the optically active polymer and the D isomer amount [% by mass] of the optically active polymer, and multiplying the quotient by 100.

For the L isomer amount [% by mass] of the optically active polymer and the D isomer amount [% by mass] of the optically active polymer, values obtained by a method using high performance liquid chromatography (HPLC) are used. The specifics of the measurement will be described later.

Among the optically active polymers described above, a compound including a main chain that contains a repeating unit represented by the following formula (1) is preferable from the viewpoint of increasing the optical purity and improving the piezoelectricity.

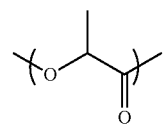

(1)

Examples of the compound containing a repeating unit represented by formula (1) as a main chain include polylactic acid polymers. Among these, polylactic acid is preferred, and a homopolymer of L-lactic acid (PLLA) or a homopolymer of D-lactic acid (PDLA) is most preferred.

The polylactic acid polymer refers to any one of "polylactic acid", "a copolymer of L-lactic acid or D-lactic acid and a polyfunctional compound capable of being copolymerized with L-lactic acid or D-lactic acid", or a mixture thereof. The "polylactic acid" is a polymer having a long chain structure formed by polymerization of lactic acid via ester bonding, and it is known that polylactic acid can be produced by a lactide method in which lactide is produced as an intermediate, a direct polymerization method including heating lactic acid in a solvent under a reduced pressure, and polymerizing the same while removing water, or the like. Examples of the "polylactic acid" include a homopolymer of L-lactic acid, a homopolymer of D-lactic acid, a block copolymer containing a polymer of at least one of L-lactic acid or D-lactic acid, and a graft copolymer containing a polymer of at least one of L-lactic acid or D-lactic acid.

Examples of the copolymerizable polyfunctional compound include hydroxycarboxylic acid, such as glycolic acid, dimethyl glycolic acid, 3-hydroxybutyric acid, 4-hydroxybutyric acid, 2-hydroxypropanoic acid, 3-hydroxypropanoic acid, 2-hydroxyvaleric acid, 3-hydroxyvaleric acid, 4-hydroxyvaleric acid, 5-hydroxyvaleric acid, 2-hydroxycaproic acid, 3-hydroxycaproic acid, 4-hydroxycaproic acid, 5-hydroxycaproic acid, 6-hydroxycaproic acid, 6-hydroxymethyl caproic acid, and mandelic acid; cyclic ester, such as glycolide, β-methyl-δ-valerolactone, γ-valerolactone, and ε-caprolactone; polyvalent carboxylic acid, such as oxalic acid, malonic acid, succinic acid, glutaric acid, adipic acid, pimelic acid, azelaic acid, sebacic acid, undecanedioic acid, dodecanedioic acid, and terephthalic acid, and anhydrides thereof; polyhydric alcohol, such as ethylene glycol, diethylene glycol, triethylene glycol, 1,2-propanediol, 1,3-propanediol, 1,3-butanediol, 1,4-butanediol, 2,3-butanediol, 1,5-pentanediol, 1,6-hexanediol, 1,9-nonanediol, 3-methyl-1,5-pentanediol, neopentylglycol, tetramethyleneglycol, and 1,4-hexanedimethanol; polysaccharide, such as cellulose; and aminocarboxylic acid, such as α-amino acid.

Examples of the "copolymer of L-lactic acid or D-lactic acid and a polyfunctional compound capable of being copolymerized with L-lactic acid or D-lactic acid" include a block copolymer or a graft copolymer having a polylactic acid sequence capable of generating a spiral crystal.

The concentration of a structure derived from a copolymer component in the optically active polymer is preferably 20 mol % or less. For example, when the optically active polymer is a polylactic acid polymer, with respect to the total number of moles of a structure derived from lactic acid and a structure derived from a compound copolymerizable with lactic acid (copolymer component) in the polylactic acid polymer, the copolymer component is preferably 20 mol % or less.

The optically active polymer (for example, polylactic acid polymer) can be produced by, for example, a method disclosed in JP-A Nos. S59-096123 and H7-033861 in which the optically active polymer is obtained by performing direct dehydration condensation of lactic acid and a method disclosed in, for example, U.S. Pat. Nos. 2,668,182 and 4,057,357 in which ring opening polymerization is performed using lactide which is a cyclic dimer of lactic acid.

In order that the optically active polymer (for example, polylactic acid polymer) obtained by the manufacturing methods described above has an optical purity of 95.00% ee or more, when polylactic acid is produced by a lactide method, for example, it is preferable to polymerize lactide whose optical purity has been increased to an optical purity of 95.00% ee or more by crystallization operation.

[Weight Average Molecular Weight of Optically Active Polymer]

The weight average molecular weight (Mw) of the optically active polymer according to the present invention is from 50,000 to 1,000,000. When the lower limit of the weight average molecular weight of the optically active polymer is less than 50,000, the mechanical strength of an article formed from the optically active polymer is insufficient. The lower limit of the weight average molecular weight of the optically active polymer is preferably 100,000 or more, and more preferably 150,000 or more. On the other hand, when the upper limit of the weight average molecular weight of the optically active polymer exceeds 1,000,000, it is difficult to form an article from the optically active polymer (into a film shape by extrusion molding, for example).

The upper limit of the weight average molecular weight is preferably 800,000 or less, and more preferably 300,000 or less.

The molecular weight distribution (Mw/Mn) of the optically active polymer is preferably from 1.1 to 5, and more preferably from 1.2 to 4, from the viewpoint of the strength of a piezoelectric polymer layer. The molecular weight distribution is further preferably from 1.4 to 3. Meanwhile, the weight average molecular weight Mw of the polylactic acid polymer and the molecular weight distribution (Mw/Mn) are measured by the following GPC measurement method, using gel permeation chromatograph (GPC).

—GPC Measurement Device—
GPC-100, manufactured by Waters
—Column—
SHODEX LF-804, manufactured by Showa Denko K.K
—Preparation of Sample—
Polylactic acid polymer is dissolved in a solvent (for example, chloroform) at 40° C., thereby preparing a sample solution with a concentration of 1 mg/mL.
—Measurement Conditions—
0.1 mL of the sample solution is introduced into a column with a solvent (chloroform) at a temperature of 40° C. at a flow rate of 1 mL/min.

The sample concentration in the sample solution separated in the column is measured with a differential refractometer. A universal calibration curve with a polystyrene standard sample is created to calculate the weight average molecular weight (Mw) and the molecular weight distribution (Mw/Mn) of the polylactic acid polymer.

As a polylactic acid polymer, commercially available polylactic acid may be used. Examples of commercially available polylactic acid include PURASORB (PD and PL) produced by PURAC, LACEA (H-100 and H-400) produced by Mitsui Chemicals Inc., and Ingeo 4032D and 4043D produced by NatureWorks LLC.

When a polylactic acid polymer is used as the optically active polymer, it is preferable to produce the optically active polymer by a lactide method or a direct polymerization method in order to obtain a polylactic acid polymer having a weight average molecular weight (Mw) of 50,000 or more.

The piezoelectric polymer layer according to the present invention may contain only one kind of the optically active polymers or may contain two or more kinds thereof.

In the piezoelectric polymer layer according to the invention, although the content of the optically active polymer (the total content when two or more kinds are used, the same applies to the following) is not limited particularly, the content is preferably 80% by mass or more based on the total mass of the piezoelectric polymer layer.

When the content is 80% by mass or more, the piezoelectric constant tends to increase.

[Stabilizer (B)]

It is preferable that the piezoelectric polymer layer according to the present invention contains at least one kind of stabilizer (B) having one or more kinds of functional groups selected from the group consisting of a carbodiimide group, an epoxy group, and an isocyanate group and having a weight average molecular weight of from 200 to 60,000.

According to the constitution, the hydrolyzability of the optically active polymer is further reduced, and the moist heat resistance of the piezoelectric polymer layer is further improved.

In order to reduce the hydrolyzability of the optically active polymer, there have been known many methods such as a method of reducing unreacted monomers such as polyester and impurities in polymer and a low molecular weight compound such as a chain/cyclic oligomer (for example, JP-A No. H9-12688), a method of adding an aromatic carbodiimide (for example, Japanese National-Phase Publication (JP-A) No. 2001-525473), and a method of adding an oxazoline compound (for example, Japanese Patent Application Laid-Open (JP-A) No. 2007-77193). However, there has not been yet known a method of reducing the hydrolyzability of the optically active polymer without significantly impairing the piezoelectricity and the transparency and thereby improving the reliability of the piezoelectric polymer layer containing a helical chiral polymer having optical activity.

According to the studies made by the present inventors, the inventors have found that when a specified amount of the stabilizer (B) having a specified functional group is added to a helical chiral polymer having optical characteristics, the hydrolyzability of aliphatic polyester is reduced without significantly lowering the piezoelectricity and the transparency, and the moist heat resistance and the reliability of the piezoelectric polymer layer can be improved.

Although the operation obtained by the addition of the specified amount of the stabilizer (B) is not clear, it is considered as follows.

It is estimated that hydrolysis of the optically active polymer proceeds according to the following scheme. Thus, in order to reduce the hydrolysis, there have been considered a method of reducing contact with water by lamination or the like, a method of forming a crosslinked structure at a hydrolyzed site in the system, and a method of blocking a free carboxy group. Thus, it is considered that the hydrolysis can be reduced by using a stabilizer having a functional group capable of easily forming an interaction with both a hydroxy group and a carboxy group as functional groups, and more preferably a stabilizer having a functional group capable of easily forming an interaction with a plurality of hydroxy groups and carboxy groups.

When a stabilizer having a functional group interacting with both a hydroxy group and a carboxy group and having a molecular weight in the specified range is used, in the crystallization of the optically active polymer, the stabilizer easily moves from a portion which easily forms crystals (specifically, a region where molecular chains are not broken) to a portion which hardly forms crystals (a region where a part of molecular chains are broken and hydroxy groups or carboxy groups are generated). Thus, it is considered that a stabilizer does not inhibit crystallization of the portion which easily forms crystals and exists more densely and uniformly at a low crystalline portion having low moist heat resistance than a high crystalline portion, so that the moist heat resistance can be improved efficiently.

Meanwhile, when a compound having an oxazoline group, which is known as a stabilizer for an optically active polymer, is used, the oxazoline group reacts with a carboxy group, but hardly reacts with a hydroxy group. Consequently, in the crystallization of the optically active polymer, oxazoline exists also in a portion which easily forms crystals to suppress crystallization, and further, depending on a structure of a compound to be used, it may act as a nucleus for crystal growth to form a large crystal locally. Thus, there is concern about decrease in the transparency of a piezoelectric polymer layer. Further, it is considered that since oxazoline hardly moves to a lower crystalline portion, an effect of improving the moist heat resistance cannot be obtained sufficiently.

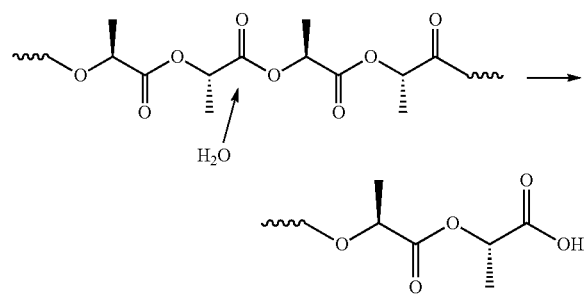

Examples of a specific functional group that can interact with both a hydroxy group and a carboxy group to reduce hydrolysis reaction according to the above scheme include at least one kind of functional groups selected from the group consisting of a carbodiimide group, an isocyanate group, and an epoxy group having the following structures, and among them, the carbodiimide group is preferable from a viewpoint of effectiveness.

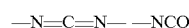

The weight average molecular weight of the stabilizer (B) is preferably from 200 to 60,000, more preferably from 200 to 30,000, and still more preferably from 300 to 18,000. When the molecular weight falls in the range, as described above as the operation, the movement of the stabilizer (B) is facilitated, and it is assumed that the effect of improving the moist heat resistance can be obtained sufficiently.

(Carbodiimide Compound)

A carbodiimide compound having a carbodiimide group and used as the stabilizer (B) has one or more carbodiimide groups in a molecule. As the carbodiimide compounds (including a polycarbodiimide compound), those synthesized by a publicly known process may be used. Examples thereof include those that can be synthesized by applying various isocyanates to a decarboxylation condensation reaction without a solvent or in an inert solvent at a temperature of approximately 70° C. or more using an organic phosphorous compound or an organometallic compound as a catalyst.

Examples of a monocarbodiimide compound included in the carbodiimide compound include dicyclohexylcarbodiimide, dimethylcarbodiimide, diisobutylcarbodiimide, dioctylcarbodiimide, t-butylisopropylcarbodiimide, diphenylcarbodiimide, di-t-butylcarbodiimide, and di-β-naphthyl carbodiimide, and among them, especially from a standpoint of easy industrial availability, dicyclohexylcarbodiimide, or bis-2,6-diisopropylphenylcarbodiimide is suitable.

As a polycarbodiimide compound contained in the carbodiimide compound, polycarbodiimide compounds produced by various processes may be used. Polycarbodiimide compounds produced by conventional processes for producing polycarbodiimide (for example, U.S. Pat. No. 2,941,956, Japanese Patent Publication (JP-B) No. S47-33279, J. Org. Chem. 28, 2069-2075 (1963), Chemical Review 1981, Vol. 81 No. 4, p 619-621) may be used. Specifically, the carbodiimide compound described in Japanese Patent No. 4084953 may be used.

Examples of polycarbodiimide compound include poly(4,4'-dicyclohexylmethane carbodiimide), poly(tetramethylxylylene carbodiimide), poly(N,N-dimethylphenylcarbodiimide), and poly(N,N'-di-2,6-diisopropylphenylcarbodiimide). A polycarbodiimide compound is not limited particularly as long as it has one or more carbodiimide groups in a molecule having such a function.

As the carbodiimide compound, commercial products are available. Examples thereof include B2756 (trade name) produced by Tokyo Chemical Industry Co., Ltd., Carbodilite LA-1 produced by Nisshinbo Chemical Inc., and Stabaxol P, Stabaxol P400, and Stabaxol I (trade names) produced by Rhein Chemie Rheinau GmbH.

(Isocyanate Compound)

Examples of a compound having an isocyanate group (isocyanate compound) to be used as the stabilizer (B) include hexylisocyanate, cyclohexyl isocyanate, benzyl isocyanate, phenethyl isocyanate, butyl isocyanatoacetate, dodecyl isocyanate, octadecyl isocyanate, 3-(triethoxysilyl) propyl isocyanate, 2,4-tolylene diisocyanate, 2,6-tolylene diisocyanate, m-phenylene diisocyanate, p-phenylene diisocyanate, 4,4'-diphenylmethane diisocyanate, 2,4'-diphenylmethane diisocyanate, 2,2'-diphenylmethane diisocyanate, 3,3'-dimethyl-4,4'-biphenylene diisocyanate, 3,3'-dimethoxy-4,4'-biphenylene diisocyanate, 3,3'-dichloro-4,4'-biphenylene diisocyanate, 1,5-naphthalene diisocyanate, 1,5-tetrahydronaphthalene diisocyanate, tetramethylene diisocyanate, 1,6-hexamethylene diisocyanate, dodecamethylene diisocyanate, trimethylhexamethylene diisocyanate, 1,3-cyclohexylene diisocyanate, 1,4-cyclohexylene diisocyanate, xylylene diisocyanate, tetramethylxylylene diisocyanate, hydrogenated xylylene diisocyanate, lysine diisocyanate, isophorone diisocyanate, 4,4'-dicyclohexylmethane diisocyanate, or 3,3'-dimethyl-4,4'-dicyclohexylmethane diisocyanate, diphenylmethane diisocyanate-type polyisocyanate, 1,6-hexamethylene diisocyanate-type polyisocyanate, xylylenediisocyanate-type polyisocyanate, and isophoronediisocyanate-type polyisocyanate.

(Epoxy Compound)

Examples of a compound having an epoxy group (epoxy compound) to be used as the stabilizer (B) include N-glycidyl phthalimide, ortho-phenylphenyl glycidyl ether, phenyl glycidyl ether, p-t-butylphenyl glycidyl ether, hydroquinone diglycidyl ether, resorcinol diglycidyl ether, 1,6-hexanediol diglycidyl ether, diethyleneglycol diglycidyl ether, polyethylene glycol diglycidyl ether, trimethylolpropane triglycidyl ether, bisphenol A-diglycidyl ether, hydrogenated bisphenol A-diglycidyl ether, a phenol novolac-type epoxy resin, a cresol novolac-type epoxy resin, and an epoxidized polybutadiene.

The stabilizer (B) may be used singly or in combination of two or more thereof.

Examples of a preferable aspect of the stabilizer (B) include an aspect, in which a stabilizer (B1) having one or more kinds of functional groups selected from the group consisting of a carbodiimide group, an epoxy group, and an isocyanate group and having a number average molecular weight of from 200 to 900 and a stabilizer (B2) having in a molecule two or more functional groups of one or more kinds selected from the group consisting of a carbodiimide group, an epoxy group, and an isocyanate group and having a weight average molecular weight of from 1,000 to 60,000 are used in combination. The weight average molecular weight of the stabilizer (B1) with a number average molecular weight of from 200 to 900 is about from 200 to 900, and the number average molecular weight and the weight average molecular weight of the stabilizer (B1) have almost the same values.

Specific examples of the stabilizer (B1) include dicyclohexylcarbodiimide, bis-2,6-diisopropylphenylcarbodiimide, hexyl isocyanate, octadecyl isocyanate, 3-(triethoxysilyl) propyl isocyanate, N-glycidyl phthalimide, ortho-phenylphenyl glycidyl ether, phenyl glycidyl ether, and p-t-butylphenyl glycidyl ether.

Meanwhile, specific examples of the stabilizer (B2) include poly(4,4'-dicyclohexylmethane carbodiimide), poly(tetramethylxylylene carbodiimide), poly(N,N-dimethylphenylcarbodiimide), poly(N,N'-di-2,6-diisopropylphenylcarbodiimide), diphenylmethane diisocyanate-type polyisocyanate, 1,6-hexamethylene diisocyanate-type polyisocyanate, xylylene diisocyanate-type polyisocyanate, isophorone diisocyanate-type polyisocyanate, phenol novolac-type epoxy resin, cresol novolac-type epoxy resin, and epoxidized polybutadiene.

When the stabilizer (B1) with a relatively low molecular weight and the polyfunctional stabilizer (B2) with a relatively high molecular weight are contained, the moist heat resistance is especially improved. Considering a balance between the additive amounts of them, it is preferable from a viewpoint of improving transparency to contain a larger amount of the stabilizer (B1) which is monofunctional and has a relatively low molecular weight. The amount of the stabilizer (B2) is preferably in a range of from 10 parts by weight to 150 parts by weight based on 100 parts by weight of the stabilizer (B1) from a viewpoint of coexistence of the transparency and the moist heat resistance, and more preferably in a range of from 50 parts by weight to 100 parts by weight.

Further, an aspect in which the stabilizer (B) contains a stabilizer (B3) having in a molecule one functional group selected from the group consisting of a carbodiimide group, an epoxy group, and an isocyanate group is also a preferable aspect from a viewpoint of improving the dimensional stability. Since the stabilizer (B3) has in a molecule only one functional group selected from the group consisting of a carbodiimide group, an epoxy group, and an isocyanate group, a region of an optically active polymer (A) having hydroxy groups and carboxyl groups generated by hydrolysis interposes the stabilizer (B3) and is less likely to be cross-linked. Thus, it is assumed that molecular chains of the optically active polymer (A) are suitably flexibly displaced to disperse internal stress in a piezoelectric polymer layer so that the dimensional stability of the piezoelectric polymer layer is improved.

The weight average molecular weight of a compound having in a molecule one functional group selected from the group consisting of a carbodiimide group, an epoxy group, and an isocyanate group is preferably from 200 to 2000, more preferably from 200 to 1500, and still more preferably from 300 to 900.

Specific examples of a compound having in a molecule one functional group selected from the group consisting of a carbodiimide group, an epoxy group, and an isocyanate group include dicyclohexylcarbodiimide, bis-2,6-diisopropylphenylcarbodiimide, hexyl isocyanate, octadecyl isocyanate, 3-(triethoxysilyl)propyl isocyanate, N-glycidylphthalimide, ortho-phenylphenyl glycidyl ether, phenyl glycidyl ether, and p-t-butylphenyl glycidyl ether. Among them, dicyclohexylcarbodiimide and bis-2,6-diisopropylphenylcarbodiimide are preferable, and bis-2,6-diisopropylphenylcarbodiimide is more preferable.

The stabilizer (B3) and a stabilizer (B4) having in a molecule two or more functional groups selected from the group consisting of a carbodiimide group, an epoxy group, and an isocyanate group (for example, the stabilizer (B2) is included) may be used in combination. The amount of the stabilizer (B4) having in a molecule two or more functional groups selected from the group consisting of a carbodiimide group, an epoxy group, and an isocyanate group is preferably from 5 parts by weight to 200 parts by weight based on 100 parts by weight of the stabilizer (B3) from a viewpoint of a balance among the transparency, the moist heat resistance, and the dimensional stability, and more preferably in a range of from 10 parts by weight to 100 parts by weight.

(Weight Average Molecular Weight and Number Average Molecular Weight of Stabilizer (B))

The number average molecular weight (Mn) and the weight average molecular weight (Mw) of the stabilizer (B) are measured by the measurement method using gel permeation chromatograph (GPC) described in the section for the optically active polymer (A). In addition to the method using GPC, the number average molecular weight (Mn) and the weight average molecular weight (Mw) may be measured by measurement methods such as GC-MS, FAB-MS, ESI-MS, and TOF-MS.

(Additive Amount of Stabilizer (B))

The additive amount of the stabilizer (B) is preferably from 0.01 part by weight to 10 parts by weight based on 100 parts by weight of the optically active polymer (A). In order to attain higher reliability (specifically the reliability at 500 hours according to the reliability test described below), the additive amount is more preferably 0.7 part by weight or more. In particular, when aliphatic carbodiimide is used as a stabilizer, the content of from 0.01 part by weight to 2.8 parts by weight is further preferable from a viewpoint of transparency. When the additive amount is in the above range, the reliability of a piezoelectric material can be enhanced without significantly impairing the internal haze of the piezoelectric polymer layer according to the present invention.

When two or more kinds of the stabilizers (B) are used in combination, the additive amount refers to the total amount thereof.

Meanwhile, from a viewpoint of lowering the internal haze and improving or maintaining the piezoelectric constant, the additive amount of the stabilizer (B) is preferably from 0.01 part by weight to 1.2 parts by weight based on 100 parts by weight of an aliphatic polyester (A) having optical activity, more preferably from 0.01 part by weight to 0.7 part by weight, and still more preferably from 0.01 part by weight to 0.6 part by weight.

[Other Components]

The piezoelectric polymer layer according to the present invention may contain other components (for example, a known resin typified by polyvinylidene fluoride, polyethylene resin, and polystyrene resin, inorganic fillers such as silica, hydroxyapatite and montmorillonite, and known crystal nucleating agents such as phthalocyanine) other than the above-described optically active polymers, insofar as the effect of the invention is not impaired.

The piezoelectric polymer layer according to the present invention may contain helical chiral polymers other than the above-described optically active polymer (that is, the helical chiral polymer having a weight average molecular weight (Mw) of from 50,000 to 1,000,000 and having optical activity), insofar as the effect of the invention is not impaired.

(Inorganic Fillers)

The piezoelectric polymer layer according to the present invention may contain at least one kind of an inorganic filler.

For example, in order to form the piezoelectric polymer layer into a transparent film in which generation of voids, such as bubbles, is reduced, inorganic fillers such as hydroxy apatite may be nano-dispersed into the piezoelectric polymer layer. However, in order to allow an inorganic filler to be nano-dispersed, a large amount of energy is required for crushing aggregates. On the other hand, when the inorganic filler is not nano-dispersed, the transparency of the film may decrease in some cases. Accordingly, when the piezoelectric polymer layer according to the present invention contains an inorganic filler, the content of the inorganic filler based on the total mass of the piezoelectric polymer layer is preferably less than 1% by mass. When the piezoelectric polymer layer contains a component other than the optically active polymer, the content of the component other than the optically active polymer is preferably 20% by mass or less, and more preferably 10% by mass or less based on the total mass of the piezoelectric polymer layer.

(Crystallization-Promoting Agent (Crystal Nucleating Agent))

The piezoelectric polymer layer according to the present invention may contain at least one kind of crystallization-promoting agent (crystal nucleating agent).

The crystallization-promoting agent (crystal nucleating agent) is not limited particularly as long as the effect of promoting crystallization is recognized. However, it is desirable to select a substance having a crystalline structure with an interplanar spacing almost equal to the interplanar spacing of the crystal lattice of the optically active polymer. This is because a substance with a more equal interplanar spacing has a higher effect as a nucleating agent.

For example, when polylactic acid-based resin is used as the optically active polymer, zinc phenylsulfonate, melamine polyphosphate, melamine cyanurate, zinc phenylphosphonate, calcium phenylphosphonate and magnesium phenylphosphonate which are organic substances, and talc and clay which are inorganic substances may be used. Among them, zinc phenylphosphonate which has an interplanar spacing most similar to that of polylactic acid and provides a good effect of promoting formation of crystals is preferred. As the crystallization-promoting agent used, commercially available one may be used. Specific examples include zinc phenylphosphonate (trade name: Ecopromote) (produced by Nissan Chemical Industries, Ltd.).

From the viewpoint of a better crystal promotion effect and the maintenance of a biomass degree, the content of the crystal nucleating agent is preferably from 0.01 to 1.0 part by weight, more preferably from 0.01 to 0.5 part by weight, and particularly preferably from 0.02 to 0.2 part by weight based on 100 parts by weight of the optically active polymer.

When the content of the crystal nucleating agent is 0.01 part by weight or more, the crystal promotion effect is more effectively obtained. When the content of the crystal nucleating agent is less than 1.0 part by weight, the rate of crystallization is more easily controlled.

<Production of Piezoelectric Polymer Layer>

A process for producing the piezoelectric polymer layer according to the present invention is not limited particularly as long as the degree of crystallinity can be regulated and, at the same time, the product of the standardized molecular orientation MORc and the degree of crystallinity can be regulated. Preferred is a method in which the degree of crystallinity is regulated to 20% to 80%, and the product of the standardized molecular orientation MORc and the degree of crystallinity can be regulated to 25 to 700.

As the process for producing the piezoelectric polymer layer according to the present invention, there may be used, for example, a method of applying crystallization and stretching (either of them may be performed first) to a sheet containing the above-described optically active polymer and being in an amorphous state and regulating the conditions of the crystallization and the stretching so as to regulate both the degree of crystallinity and the product of the standardized molecular orientation MORc and the degree of crystallinity.

The "crystallization" referred to herein is a concept including preliminary crystallization and annealing treatment to be described later.

The sheet in an amorphous state is obtained by heating a single optically active polymer or a mixture containing the optically active polymer to a temperature of a melting point Tm or more of the optically active polymer and then rapidly cooling the single optically active polymer or the mixture. The temperature for rapid cooling is 50° C., for example.

In the process for producing the piezoelectric polymer layer according to the present invention, as a raw material of the piezoelectric polymer layer (or the sheet in an amorphous state), the optically active polymer (such as a polylactic acid polymer) may be used singly. Alternatively, a mixture of two or more kinds of the above-described optically active polymers (such as polylactic acid polymers) or a mixture of at least one kind of the above-described optically active polymer and at least one kind of other components (for example, the above-described stabilizers) may be used.

The above-described mixture is preferably a mixture obtained by melt-kneading.

More specifically, for example, when two or more kinds of optically active polymers are mixed or when one or more kinds of optically active polymers is mixed with other components (for example, the above-described inorganic filler or crystal nucleating agent), the optically active polymers to be mixed may be melt-kneaded (with other components, if necessary) on the conditions of a mixer revolution speed of from 30 rpm to 70 rpm and 180° C. to 250° C. for 5 minutes to 20 minutes using a melt-kneading machine [manufactured by Toyo Seiki Seisaku-sho, Ltd.; Labo Plastomill Mixer]. This yields a blend of a plurality of kinds of optically active polymers or a blend of the optically active polymers with other components such as inorganic fillers.

The piezoelectric polymer layer according to the present invention may be produced, for example, by a production process including a first process of heating a sheet in an amorphous state containing a helical chiral polymer to obtain a preliminarily crystallized sheet and a second process of stretching the preliminarily crystallized sheet mainly in a uniaxial direction. Specifically, the piezoelectric polymer layer may be produced by the process described in Japanese Patent No. 4934235 or WO 2010/104196.

The piezoelectric polymer layer according to this invention may be produced by a production process including, in the following order, a process of stretching a sheet containing an optically active polymer (preferably, a sheet in an amorphous state) mainly in a uniaxial direction and a process of annealing the stretched sheet.

The stretching conditions and the annealing conditions are suitably regulated so that preferably, the degree of crystallinity of a piezoelectric polymer layer to be produced is from 20% to 80%, and the product of the standardized molecular orientation MORc and the degree of crystallinity is from 25 to 700.

<Optical Compensation Layer>

The display device and the laminated optical film of the present invention have at least one optical compensation layer (for example, the optical compensation layer 20) satisfying the expression (1).

The optical compensation layer is not limited particularly as long as it satisfies the expression (1).

For example, among the constituents of the display device including a linear polarizer and the above-described piezoelectric polymer layer, when a member satisfying the expression (1) exists as a member other than the linear polarizer and the piezoelectric polymer layer, this member can be used as the optical compensation layer (namely, another optical compensation layer may not be provided separately from this member).

In the expression (1), Rth represents a phase difference (nm) in a thickness direction of the optical compensation layer at a wavelength of 550 nm.

In particular, the phase difference Rth (nm) in the thickness direction of the optical compensation layer at a wavelength of 550 nm is defined by the following expression a.

An in-plane phase difference Re (nm) of the optical compensation layer at a wavelength of 550 nm is defined by the following expression b.

$Rth=\{(nx+ny)/2-nz\} \times d2$  Expression a:

$Re=(nx-ny) \times d2$  Expression b:

[In the expression a and the expression b, nx represents a refractive index in an in-plane slow axis direction of the optical compensation layer at a wavelength of 550 nm, ny represents a refractive index in an in-plane fast axis direction of the optical compensation layer at a wavelength of 550 nm, nz is a refractive index in the thickness direction of the optical compensation layer at a wavelength of 550 nm, and d2 represents a thickness (nm) of the optical compensation layer.]

For the Rth and the Re, the descriptions of JP-A 2012-7110 can be suitably referred.

In the optical compensation layer according to the present invention, the Rth is preferably from −3000 nm to −100 nm, and more preferably from −1500 nm to −200 nm.

In the optical compensation layer according to the present invention, although Re is not limited particularly, the Re is preferably from 0 nm to 3000 nm and more preferably from 0 nm to 1500 nm.

Although the thickness of the optical compensation layer according to the present invention is not limited particularly, the thickness may be from 1 μm to 1000 μm, for example.

As the optical compensation layer in the present invention, a stretched polymer film and a solidified layer or a cured layer of a liquid crystal composition may be used.

(Stretched Polymer Film)

It is preferable that the stretched polymer film contains polymer exhibiting negative intrinsic birefringence.

Here, the "polymer exhibiting negative intrinsic birefringence" means a polymer in which when polymers are oriented, a long axis of an indicatrix is generated in a direction perpendicular to an orientation direction of a polymer chain.

Examples of the polymer exhibiting negative intrinsic birefringence include a polymer to which a chemical bond and/or a functional group, such as an aromatic ring and a carbonyl group, having high polymerization anisotropy is introduced as a side chain.

As the polymer exhibiting negative intrinsic birefringence, methacrylate-based polymer, styrene-based polymer, maleimide-based polymer, or the like is preferably used. One or more than two kinds of them may be used.

The methacrylate-based polymer is obtained by, for example, addition copolymerization of methacrylate-based monomers. Examples of the methacrylate-based monomer include methyl methacrylate, butyl methacrylate, and cyclohexyl methacrylate.

The styrene-based polymer is obtained by, for example, addition copolymerization of styrene-based monomers. Examples of the styrene-based monomer include styrene, α-methyl styrene, o-methyl styrene, p-methyl styrene, p-chlorostyrene, p-nitrostyrene, p-aminostyrene, p-carboxystyrene, p-phenylstyrene, 2,5-dichlorostyrene, and p-t-butyl styrene.

The maleimide-based polymer is obtained by, for example, addition copolymerization of maleimide-based monomers. Examples of the maleimide-based monomer include N-ethyl maleimide, N-cyclohexyl maleimide, N-phenyl maleimide, N-(2-methylphenyl) maleimide, N-(2-ethylphenyl) maleimide, N-(2-n-propylphenyl) maleimide, N-(2-isopropyl phenyl) maleimide, N-(2,6-dimethylphenyl) maleimide, N-(2,6-diethylphenyl) maleimide, N-(2,6-di-isopropyl phenyl) maleimide, N-(2-methyl-6-ethylphenyl) maleimide, N-(2-chlorophenyl) maleimide, N-(2,6-dibromophenyl) maleimide, N-(2-biphenyl) maleimide, and N-(2-cyanophenyl) maleimide. Maleimide-based monomer is available from, for example, Tokyo Chemical Industry Co., Ltd.

The polymer exhibiting negative intrinsic birefringence may be copolymerized with other monomers as long as the polymer exhibiting negative intrinsic birefringence can be obtained. The copolymerization of other monomers can improve brittleness and molding processability. Examples of the other monomers include olefin such as ethylene, propylene, 1-butene, isobutene, 1,3-butadiene, 2-methyl-1-butene, 2-methyl-1-pentene, and 1-hexene, (meth)acrylonitrile, (meth)acrylate such as methyl acrylate and methyl methacrylate, maleic anhydride, and vinylester such as vinyl acetate.

When the polymer exhibiting negative intrinsic birefringence is a copolymer of the styrene-based monomer and the above-described other monomers, the blending ratio of the styrene-based monomer is preferably from 50 mol % to 80 mol %. When the polymer exhibiting negative intrinsic birefringence is a copolymer of the maleimide-based monomer and the above-described other monomers, the blending ratio of the maleimide-based monomer is preferably from 2 mol % to 50 mol %. When the styrene-based monomer or the maleimide-based monomer is blended to fall within the above range, a polymer film excellent in brittleness and molding processability can be obtained.

As the polymer exhibiting negative intrinsic birefringence, styrene-maleic anhydride copolymer, styrene-(meth) acrylonitrile copolymer, styrene-(meth)acrylate copolymer, styrene-maleimide copolymer, vinylester-maleimide copolymer, or olefin-maleimide copolymer is preferably used. One or more than two kinds of them may be used. Those polymers exhibit high negative intrinsic birefringence and can have high heat resistance. Those polymers are available from, for example, NOVA Chemicals Japan Ltd. and Arakawa Chemical Industries, Ltd.

As the polymer exhibiting negative intrinsic birefringence, the polymer described in paragraphs 0027 to 0028 of JP-A No. 2009-192611 may be used.

The weight average molecular weight (Mw) of the polymer exhibiting negative intrinsic birefringence is preferably from 20,000 to 500,000. A glass transition temperature (Tg) of the polymer exhibiting negative intrinsic birefringence is preferably 110 to 185° C. When such a polymer is used, a polymer film exhibiting excellent heat stability and having excellent stretching properties can be obtained. The weight average molecular weight (Mw) is a value measured by a gel permeation chromatography (polystyrene standards) using a tetrahydrofuran solvent. The glass transition temperature (Tg) can be obtained by a DSC method according to JIS K 7121.

The optical compensation layer (stretched film) can be obtained by stretching the polymer film under any suitable stretching conditions. Specifically, the optical compensation layer can be obtained by stretching the polymer film in a vertical direction or in a horizontal direction. Examples of the stretching method include a longitudinal uniaxial stretching method and a transverse uniaxial stretching method. In the stretching, any suitable stretching machine may be used. Specific examples of the stretching machine include a roll stretching machine, a tenter stretching machine, and a biaxial stretching machine. As a stretching temperature, when the glass transition temperature of a polymer forming the polymer film is Tg (° C.), the stretching temperature is preferably (Tg−50)° C. to (Tg+50)° C. and more preferably (Tg−30)° C. to (Tg+30)° C. The stretching temperature is typically from 80 to 250° C., preferably from 90 to 200° C., and more preferably from 100 to 180° C. A stretching ratio is preferably 3.0 times or less, more preferably from 1.1 to 3.0 times, and particularly preferably from 1.2 to 2.8 times.

When the optical compensation layer according to the present invention is a stretched polymer film, the thickness of the stretched film is preferably from 20 to 1000 μm, more preferably from 100 to 700 μm, and particularly preferably from 200 to 500 μm.

As the stretched polymer film, the first optical compensation layer described in JP-A No. 2009-192611 may be used, for example.

(Solidified Layer or Cured Layer of Liquid Crystal Composition)

The optical compensation layer according to the present invention may be a solidified layer or a cured layer of a liquid crystal composition.

Examples of the solidified layer or the cured layer of the liquid crystal composition include a phase difference film described in paragraphs 0072 to 0078 of JP-A No. 2006-268018.

In addition, a solidified layer or a cured layer of a liquid crystal composition containing a homeotropic aligned liquid crystal compound is suitably used as the solidified layer or the cured layer of the liquid crystal composition.

Here, "homeotropic alignment" refers to a state in which liquid crystal compounds contained in a liquid crystal composition are aligned in parallel and uniformly with respect to a film normal direction.

As the solidified layer or the cured layer of the liquid crystal composition, the solidified layer or the cured layer of the liquid crystal composition containing a homeotropic aligned liquid crystal compound is more preferred, and in this layer, the liquid crystal composition contains low molecular liquid crystal having at least one polymerizable or crosslinkable functional group in a part of the molecular structure.

More preferably, the liquid crystal composition contains, in a part of the molecular structure, a low molecular liquid crystal having at least two polymerizable or crosslinkable functional groups.

When such a liquid crystal compound is used, a polymerizable (or crosslinkable) functional group is polymerized (or cross-linked) by polymerization (or cross-linking) reaction, whereby the mechanical strength of a solidified layer or a cured layer of a liquid crystal composition is increased, so that the solidified layer or the cured layer of the liquid crystal composition excellent in durability and dimensional stability can be obtained.

Examples of a low molecular liquid crystal having one mesogenic group and two polymerizable functional groups in a part of the molecular structure include "Paliocolor LC242" (trade name) manufactured by BASF Japan ($\Delta n$=0.131) and "CB 483" (trade name) manufactured by Huntsuman Corporation ($\Delta n$=0.080).

As the polymerizable functional group, any suitable functional group can be selected. Examples of such a functional group include an acryloyl group, a methacryloyl group, an epoxy group, and a vinyl ether group. Among them, an acryloyl group and a methacryloyl group are preferably used because a phase difference film having high reactivity and transparency is obtained.

When the optical compensation layer according to the present invention is a solidified layer or a cured layer of a liquid crystal composition containing a homeotropic aligned liquid crystal compound, the thickness of the layer is preferably from 0.6 µm to 20 µm, more preferably from 0.8 µm to 10 µm, and most preferably from 0.8 µm to 2.5 µm.

When the thickness of the optical compensation layer falls within the above range, it is possible to obtain a film which is excellent in productivity and workability in the formation of the film, has a practically sufficient mechanical strength, and has excellent optical uniformity.

In the solidified layer or the cured layer of the liquid crystal composition containing the homeotropic aligned liquid crystal compound, a difference (also referred to as a birefringence index ($\Delta n$)) between a refractive index (ne) of extraordinary light and a refractive index (no) of ordinary light measured at a wavelength of 589 nm at 23° C.: $\Delta n$=ne−no is preferably from −0.20 to −0.04, more preferably from −0.18 to −0.05, and most preferably from −0.14 to −0.07. By virtue of the use of a film having the birefringence index in the above range, a film thickness can be adjusted into the range where the productivity and the workability are excellent.

In the solidified layer or the cured layer of the liquid crystal composition containing the homeotropic aligned liquid crystal compound, the transmittance measured with light having a wavelength of 550 nm at 23° C. is preferably 80% or more, more preferably 85% or more, and most preferably 90% or more.

The solidified layer or the cured layer of the liquid crystal composition containing the homeotropic aligned liquid crystal compound may further contain polymeric liquid crystal represented by the following formula (I). Consequently, the orientation of the liquid crystal compound is further improved.

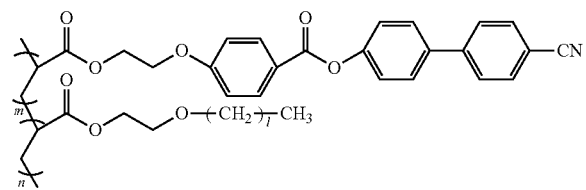

(I)

In formula (I), l represents an integer from 14 to 20, and when the sum of m and n is 100, m is 50 to 70, and n is 30 to 50.

The content of the polymeric liquid crystal is preferably from 10 parts by weight to 40 parts by weight and more preferably from 15 parts by weight to 30 parts by weight based on 100 parts by weight of all solid content of the solidified layer or the cured layer of the liquid crystal composition containing a homeotropic molecular aligned liquid crystal compound.

The solidified layer or the cured layer of the liquid crystal composition containing the homeotropic aligned liquid crystal compound can be obtained through the following process 1 to process 3, for example. Specifically, the process 1 is a process of applying vertical alignment treatment to a surface of a base (also referred to as a support), the process 2 is a process of applying a solution or a dispersion liquid of a liquid crystal composition onto a surface of the base subjected to the vertical alignment treatment and homeotropically aligning a liquid crystal compound in the liquid crystal composition, and the process 3 is a process of drying and solidifying the liquid crystal composition. Preferably, the method of forming the phase difference film includes a process 4 of curing the liquid crystal composition through ultraviolet irradiation after the processes 1 to 3. The base is usually peeled before the phase difference film is put to practical use.

As the solidified layer or the cured layer of the liquid crystal composition, the positive C-plate described in JP-A No. 2006-268018 may be used, for example.

<Linear Polarizer>

The display device and the laminated optical film of the present invention each have at least one linear polarizer (for example, the polarizing plate 14A).

The linear polarizer is not limited particularly, and examples of the linear polarizer include a stretched polymer film containing iodine or dichromatic dye and mainly composed of polyvinyl alcohol-based resin, an O-type polarizer as disclosed in U.S. Pat. No. 5,523,863, in which a liquid crystal composition containing a dichroic material and a liquid crystal compound is oriented in a fixed direction, and an E-type polarizer as disclosed in U.S. Pat. No. 6,049,428, in which lyotropic liquid crystal is oriented in a fixed direction.

Among those linear polarizers, the stretched polymer film containing iodine or dichromatic dye and mainly composed of polyvinyl alcohol-based resin is preferable from a viewpoint of a polarization degree and so on.

As the linear polarizer, the polarizer described in JP-A No. 2006-268018 may be used, for example.

The display device and the laminated optical film of the present invention may have constituents other than the piezoelectric polymer layer, the optical compensation layer, and the linear polarizer.

For example, the display device of this invention may be suitably constituted of a liquid crystal cell or an organic electroluminescence (organic EL) element.

For the configuration and constituents of the display device, the descriptions of JP-A Nos. 2006-268018, 2009-192611, and 2009-21408 and so on can be suitably referred.

EXAMPLES

Hereinafter, the present invention will be more specifically described with reference to Examples. However, the invention is not limited by the Examples.

Hereinafter, an "MD direction" refers to a direction in which a film flows (Machine Direction), and a "TD direction" refers to a direction perpendicular to the MD direction and parallel to a principal surface of a film (Transverse Direction).

<<Preparation of Piezoelectric Polymer Layer (Crystalline Piezoelectric Polymer Layer)>>

<Production of Piezoelectric Polymer Layer A>

As the helical chiral polymer (A), a polylactic acid polymer (trademark: LACEA H-400 (weight average molecular weight Mw: 200,000)) produced by Mitsui Chemicals Inc. was put into a hopper of an extruder, then extruded from a T die while being heated to 220° C. to 230° C., and was brought into contact with a cast roll at 55° C. for 0.5 minute, whereby a preliminarily crystallized sheet having a thickness of 150 μm was produced (preliminary crystallization process).

The stretching of the obtained preliminarily crystallized sheet was started at a stretching ratio of 1650 mm/min by a roll-to-roll method while the sheet was heated to 70° C., and the sheet was uniaxially stretched to 3.5 times in the MD direction (stretching process).

After that, the uniaxially stretched film was brought into contact with a roll, heated to 130° C., for 60 seconds and subjected to annealing treatment (annealing treatment process) by a roll-to-roll, and this yielded the piezoelectric polymer layer A which is a crystalline piezoelectric polymer layer.

<Measurement of Piezoelectric Polymer Layer A>

The obtained piezoelectric polymer layer A was measured as follows.

The measurement results are shown in the following Tables 1 to 3.

(Measurement of L Isomer Amount and D Isomer Amount of Helical Chiral Polymer (A))

1.0 g of a sample (piezoelectric polymer layer A) was weighed and charged in a 50-mL conical flask, and 2.5 mL of IPA (isopropyl alcohol) and 5 mL of 5.0 mol/L sodium hydroxide solution were added thereto. Then, the conical flask containing the sample solution was placed in a water bath at a temperature of 40° C., and stirring was carried out for about 5 hours until polylactic acid was completely hydrolyzed.

After cooling the sample solution to room temperature, 20 mL of 1.0 mol/L hydrochloric acid solution was added for neutralization, and the conical flask was sealed and sufficiently stirred. 1.0 mL of the sample solution was transferred to a 25-mL measuring flask, and an HPLC sample solution 1 was prepared in a mobile phase at 25 mL. 5 μL of the HPLC sample solution 1 was poured in an HPLC device, and the D/L isomer peak area of the helical chiral polymer (A) (polylactic acid) was determined under the following HPLC conditions, and the L isomer amount and the D isomer amount were calculated.

The optical purity (% ee) was calculated from the obtained result. The results are shown in the following Table 1.

—HPLC Measurement Conditions—
Column:
optical resolution column, SUMICHIRAL OA5000, manufactured by Sumika Chemical Analysis Service, Ltd.
Measuring apparatus:
liquid chromatography, manufactured by Nippon Bunko Co., Ltd.
Column temperature: 25° C.
Mobile phase:
1.0 mM-copper sulfate (II) buffer solution/IPA=98/2 (V/V)
copper sulfate (II)/IPA/water=156.4 mg/20 mL/980 mL
Mobile phase flow rate: 1.0 mL/min
Detector:
ultraviolet ray detector (UV 254 nm)

(Measurement of Weight Average Molecular Weight (Mw) and Molecular Weight Distribution (Mw/Mn))

The weight average molecular weight (Mw) and the molecular weight distribution (Mw/Mn) of the helical chiral polymer (A) contained in the piezoelectric polymer layer A was measured by the following GPC measurement method, using gel permeation chromatograph (GPC).

—GPC Measurement Method—
Measuring apparatus:
GPC-100, manufactured by Waters
Column:
Shodex LF-804, manufactured by Showa Denko K. K
Preparation of sample:
piezoelectric polymer layer A was dissolved in a solvent [chloroform] at 40° C., thereby preparing a sample solution with a concentration of 1 mg/mL.
Measurement conditions:
0.1 mL of the sample solution was introduced into a column with a solvent (chloroform) at a temperature of 40° C. at a flow rate of 1 mL/min, and the sample concentration in the sample solution separated in the column was measured with a differential refractometer.

The weight average molecular weight (Mw) of the helical chiral polymer (A) (polylactic acid) was calculated based on a universal calibration curve created with a polystyrene standard sample.

The measurement results are shown in the following Table 1.

In the following Table 1, "LA" represents LACEA H-400.

(Measurement of Melting Point Tm (° C.) and Degree of crystallinity Xc (%))

10 mg of the piezoelectric polymer layer A was accurately weighed, and a melting endothermic curve was obtained therefrom by measuring under the conditions of a temperature elevation rate of 10° C./min with a differential scanning calorimeter (DSC-1, manufactured by PerkinElmer, Co., Ltd.). The melting point Tm and the degree of crystallinity Xc (%) were obtained from the obtained melting endothermic curve.

The measurement results are shown in the following Table 2.

(Measurement of Standardized Molecular Orientation MORc)

The standardized molecular orientation MORc of the piezoelectric polymer layer (A) was measured by a microwave molecular orientation meter MOA-6000, manufactured by Oji Scientific Instruments Co., Ltd. A reference thickness tc was set to 50 μm.

The measurement results are shown in the following Table 2.

(Measurement of Internal Haze)

The "internal haze" in accordance with the present application refers to the internal haze of the piezoelectric polymer layer and measured by a general measuring method.

Specifically, the internal haze (hereinafter also referred to as the internal haze (H1)) of the piezoelectric polymer layer A was measured by measuring an optical transparency in a thickness direction. More specifically, a haze (H2) was measured while only silicone oil (Shin-Etsu Silicone (trademark) produced by Shin-Etsu Chemical Co., Ltd.; model number: KF96-100CS) was previously sandwiched between two glass plates, a haze (H3) was then measured while a film (piezoelectric polymer layer A) whose surface was coated homogeneously with silicone oil was sandwiched between two glass plates, and a difference between them was determined as in the following expression, whereby the internal haze (H1) of the piezoelectric polymer layer A was obtained. The measurement results are shown in the following Table 2.

Internal haze($H1$)=Haze($H3$)−Haze($H2$)

The haze (H2) and the haze (H3) in the above expression were measured by measuring the optical transparency in the thickness direction under the following measurement conditions using the following apparatus.

Measuring apparatus: HAZE METER TC-HIIIDPK, manufactured by Tokyo Denshoku Co., Ltd.

Sample size: 30 mm in width×30 mm in length (thickness: see the following Table 2)

Measurement condition: in conformity with JIS-K7105

Measurement temperature: room temperature (25° C.)

(Measurement of Piezoelectric Constant $d_{14}$ Using Displacement Method)

A test piece (piezoelectric polymer layer A) of 40 mm×40 mm having Ag conductive layers on both surfaces was cut at 32 mm in a direction forming 45° with the stretching direction (MD direction) of the piezoelectric polymer layer A and 5 mm in a direction perpendicular to the direction forming 45°, whereby a rectangular film of 32 mm×5 mm was formed. This film was used as a sample for piezoelectric constant measurement. A difference in distance between the maximal and minimum values of the displacement of the film occurred when a sine wave alternating voltage of 10 Hz and 300 Vpp was applied to the resultant sample was measured by a laser spectral-interference displacement meter SI-1000 manufactured by Keyence Corporation. A value obtained by dividing a measured displacement (mp–p) by a reference length of the film of 30 mm was used as an amount of deformation, and a value obtained by multiplying a value, obtained by dividing the amount of deformation by an electric field strength ((applied voltage (V))/(film thickness)) applied to the film, by 2 was used as the piezoelectric constant $d_{14}$ (pm/V). The above measurement was performed under a temperature condition of 25° C.

The measurement results are shown in the following Table 2.

(Measurement of Thickness d (μm))

The thickness d (μm) of the piezoelectric polymer layer A was measured using a digital length measuring machine DIGIMICRO STAND MS-11C manufactured by Nikon Corporation.

The measurement results are shown in the following Table 2.

(MORc×Degree of Crystallinity)

The product of MORc and the degree of crystallinity Xc (%) ("MORc×degree of crystallinity") was calculated.

The results are shown in the following Table 3.

(0.06×Degree of Crystallinity×MORc×d (μm))

The product of the MORc, the degree of crystallinity Xc (%), the thickness d (μm), and 0.06 ("0.06×degree of crystallinity×MORc×d (μm)") was calculated.

The results are shown in the following Table 3.

<Production and Measurement of Piezoelectric Polymer Layers B to E>

Piezoelectric polymer layers B to E as crystalline piezoelectric polymer layers were produced in a similar manner to the production of the piezoelectric polymer layer A, except that the operation in the production of the piezoelectric polymer layer A of putting LACEA H-400 into a hopper of an extruder was changed to operation of putting LACEA H-400 (100 parts by weight) and the stabilizers (B) of the kinds and the amounts shown in Table 1 into the hopper of the extruder and that the stretching ratio in the uniaxial stretching was changed to the stretching ratio shown in Table 2.

The obtained piezoelectric polymer layers B to E were measured (and calculated) in a similar manner to the piezoelectric polymer layer A. The measurement results are shown in Tables 1 to 3.

The stabilizers (B) shown in Table 1 are as follows.

"SI" in Table 1: produced by Tokyo Chemical Industry Co., Ltd., B2756 (trade name), bis-2,6-diisopropylphenyl-carbodiimide (the structure is as follows)

"LA" in Table 1: Carbodilite LA-1 (trade name) produced by Nisshinbo Chemical Inc., poly(4,4'-dicyclohexylmethane carbodiimide) (weight average molecular weight: about 2000, the structure is as follows)

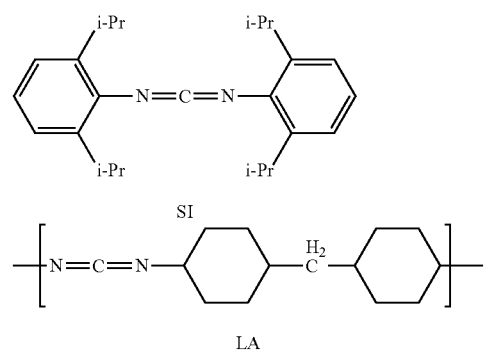

<<Preparation of Optical Compensation Layer>>

<Production of Optical Compensation Layer a>

Commercially available polymethylmethacrylate (PMMA: Sumipex EX produced by Sumitomo Chemical Co., Ltd.) was heat-pressed at 250° C. for 2 minutes and then pressed by a pressing machine set at 20° C., and this yielded a rapidly cooled film. Two opposed sides of the rapidly cooled film were fixed by a clip, and the film was stretched to 2.0 times at 110° C. in a direction perpendicular to the fixed two sides, and this yielded the optical compensation layer a as a film having a thickness of 278 μm.

For the obtained optical compensation layer a, a phase difference Re (nm) in the in-plane direction and a phase difference Rth (nm) in the thickness direction were measured under the following measurement conditions. The measurement results are shown in Table 4.

Measurement wavelength: 550 nm

Measuring apparatus: Phase difference film/optical material inspection apparatus RETS-100 manufactured by Otsuka Electronics Co., Ltd.

<Production of Optical Compensation Layer b>

An ethyl silicate solution (produced by Colcoat Co., Ltd. (2% by weight of a mixed solution of ethyl acetate and isopropyl alcohol)) was applied onto a commercially-available polyethylene terephthalate film (produced by Toray Industries, Inc, trade name: "S-27E" (thickness: 75 μm)) with a gravure coater, and this film was dried for 1 minute in an air circulation isothermal oven at 130° C.±1° C., whereby a glassy polymer film having a thickness of 0.1 μm was formed on a surface of the polyethylene terephthalate film.

Subsequently, 5 parts by weight of polymer liquid crystal (weight average molecular weight: 5000) represented by the following formula (II), 20 parts by weight of a calamitic liquid crystal compound (produced by BSAF Japan, trade name: "Paliocolor LC 242" (ne=1.654, no=1.523)) having two polymerizable functional groups in a part of the molecular structure, and 1.25 parts by weight of a photopolymerization initiator (produced by Ciba Specialty Chemicals Inc., trade name: "Irgacure 907") were dissolved in 75 parts by weight of cyclohexanone, and a solution of a liquid crystal composition was prepared. This solution was applied onto the glassy polymer film of the polyethylene terephthalate film with a rod coater to be dried for 2 minutes in an air circulation isothermal oven at 80° C.±1° C., and, thus, to be gradually cooled to room temperature (23° C.), whereby a solidified layer of a homeotropic aligned liquid crystal composition was formed on a surface of the polyethylene terephthalate film. Subsequently, the solidified layer was irradiated with ultraviolet light with an irradiation light quantity of 400 mJ/cm$^2$ under an air atmosphere, and the liquid crystal composition was cured by polymerization reaction.

The polyethylene terephthalate film was peeled, and the optical compensation layer b was obtained as a cured layer of a homeotropic aligned liquid crystal composition having a thickness of 5.5 μm.

For the obtained optical compensation layer b, the phase difference Re (nm) in the in-plane direction and the phase difference Rth (nm) in the thickness direction were measured in a similar manner to the optical compensation layer a.

The measurement results are shown in the following Table 4.

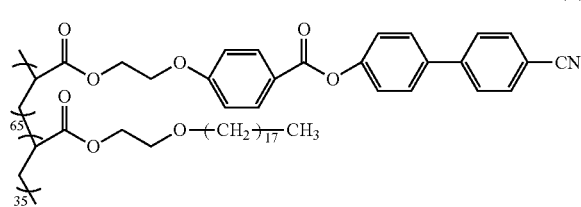

(II)

<<Preparation of Polarizing Plate>>

A polymer film (produced by Kuraray Co., Ltd., trade name: "9P75R (thickness: 75 μm, average degree of polymerization: 2,400, and saponification degree: 99.9 mol %)") mainly composed of polyvinyl alcohol was uniaxially stretched to 2.5 times while being died in a dyebath containing iodine and potassium iodide and held at 30° C.±3° C., using a roll stretching machine. Subsequently, this film was uniaxially stretched to have a length six times an original length of a polyvinyl alcohol film in an aqueous solution containing boric acid and potassium iodide and held at 60° C.±3° C. while cross-linking reaction was carried out. The obtained film was dried for 30 minutes in an air circulation isothermal oven at 50° C.±1° C., whereby a polarizing plate (linear polarizer) having a moisture percentage of 23%, a thickness of 28 μm, a polarization degree of 99.9%, and a single transmittance of 43.5% was obtained.

The two polarizing plates were provided.

Examples 1 to 8 and Comparative Examples 1 to 6

The piezoelectric polymer layers and the optical compensation layers combined as shown in the following Table 5 were provided, and the following optical evaluation (occurrence of light leakage) was carried out.

According to the evaluation, the contrast of a displayed image obtained when the piezoelectric polymer layers and the optical compensation layers are used in a display device or a laminated optical film for a display device was evaluated. Specifically, in the following optical evaluation, visual confirmation of light leakage corresponds to lowering of the contrast of a displayed image.

<<Optical Evaluation>>

A laminated sample having a structure in which a piezoelectric polymer layer and an optical compensation layer were held in the two polarizing plates arranged in a crossed Nicol state was provided. Whether the light leakage occurred when light from a fluorescent lamp was transmitted through the laminated sample was visually observed, and the occurrence of the light leakage was evaluated in accordance with the following evaluation criteria.

The evaluation was carried out both when the laminated sample was viewed from the front side (normal direction) and when the laminated sample was viewed obliquely (with respect to the normal direction) while being rotated around the normal direction.

The evaluation results are shown in the following Table 5.
—Evaluation Criteria—

A: Light leakage was not visually confirmed.

B: Although slight light leakage was visually confirmed, the light leakage was within an allowable range in practical use.

C: Light leakage was clearly visually confirmed and exceeded the allowable range in practical use.

At that time, in the Examples 1 to 3 and the Comparative Examples 1 using the optical compensation layer a in which a slow axis was detected in-plane, in a laminated sample, the in-plane slow axis of the optical compensation layer a and a stretching axis of a piezoelectric polymer layer were arranged perpendicularly to each other (namely, a stretching axis of the optical compensation layer a and the stretching axis of the piezoelectric polymer layer were arranged parallel to each other).

In the Examples 4 to 8 using the optical compensation layer b in which no slow axis was detected in-plane, even when the optical compensation layer b and the piezoelectric polymer layer are arranged in any manner, this arrangement does not affect the evaluation.

TABLE 1

| | | Component | | | | | | | |
|---|---|---|---|---|---|---|---|---|---|
| | | Helical chiral polymer (A) | | | | | Stabilizer (B) | | |
| Piezoelectric polymer layer | Type | Chirality | Mw | Mw/Mn | Optical purity (% ee) | Amount (part by weight) | Type | Molecular weight | Amount (part by weight) |
| A | LA | L | 200,000 | 2.87 | 98.5 | 100 | — | — | — |
| B | LA | L | 200,000 | 2.87 | 98.5 | 100 | SI | 363 | 1.0 |
| C | LA | L | 200,000 | 2.87 | 98.5 | 100 | LA | About 2,000 | 0.9 |
| D | LA | L | 200,000 | 2.87 | 98.5 | 100 | SI | 363 | 1.0 |
| E | LA | L | 200,000 | 2.87 | 98.5 | 100 | SI | 363 | 1.0 |

TABLE 2

| Piezoelectric polymer layer | Stretching ratio | Degree of crystallinity Xc (%) | MORc | Melting point Tm (° C.) | Internal haze (%) | Piezoelectric constant $d_{14}$ (pm/V) | Thickness d (μm) |
|---|---|---|---|---|---|---|---|
| A | 3.5 | 46.0 | 4.8 | 165.6 | 0.6 | 5.8 | 48.1 |
| B | 3.5 | 39.9 | 4.727 | 164.6 | 0.2 | 5.8 | 46.4 |
| C | 3.5 | 38.1 | 4.842 | 165.6 | 2.0 | 5.8 | 49.8 |
| D | 5.4 | 42.2 | 5.849 | 167.7 | 0.5 | 7.0 | 53.6 |
| E | 8.4 | 40.1 | 7.115 | 168.2 | 0.6 | 6.6 | 60.1 |

TABLE 3

| Piezoelectric polymer layer | MORc × degree of crystallinity | 0.06 × degree of crystallinity × MORc × d (μm) |
|---|---|---|
| A | 221 | 637.7 |
| B | 189 | 525.0 |
| C | 185 | 551.5 |
| D | 247 | 794.5 |
| E | 285 | 1028.2 |

TABLE 4

| Optical compensation layer | Material | Re (nm) | Rth (nm) |
|---|---|---|---|
| a | PMMA layer | 513 | −255 |
| b | Liquid crystal cured film | 1 | −557 |

TABLE 5

| | Piezoelectric polymer layer | Optical compensation layer | \|0.06 × degree of crystallinity × MORc × d + Rth\| | Optical evaluation Front | Optical evaluation Skew |
|---|---|---|---|---|---|
| Example 1 | A | a | 382.7 | A | B |
| Example 2 | B | a | 270.0 | A | B |
| Example 3 | C | a | 296.5 | A | B |
| Comparative Example 1 | E | a | 773.2 | A | C |
| Example 4 | A | b | 80.7 | A | A |
| Example 5 | B | b | 32.0 | A | A |
| Example 6 | C | b | 5.5 | A | A |
| Example 7 | D | b | 237.5 | A | A |
| Example 8 | E | b | 471.2 | A | B |
| Comparative Example 2 | A | NO | 637.7 | A | C |
| Comparative Example 3 | B | NO | 525.0 | A | C |
| Comparative Example 4 | C | NO | 551.5 | A | C |
| Comparative Example 5 | D | NO | 794.5 | A | C |
| Comparative Example 6 | E | NO | 1028.2 | A | C |

As shown in Table 5, in Examples 1 to 8, no light leakage was visually confirmed, or even if the light leakage was visually confirmed, the light leakage is minor and is within the allowable range in practical use. Consequently, it was found that when the combination of the piezoelectric polymer layers and the optical compensation layers of the Examples 1 to 8 was used in a display device or in a laminated optical film for a display device, the lowering of the contrast of a displayed image due to the piezoelectric polymer layer could be reduced.

The entire disclosure of Japanese Patent Application No. 2013-018803 filed Feb. 1, 2013 is incorporated by reference in this specification.

All contents of the documents, patent applications, and technical standards described in this specification are incorporated herein by reference to the same extent as that when it is specifically and individually described that the respective documents, patent applications, and the technical standards are incorporated herein by reference.

The invention claimed is:

1. A display device comprising:
   a crystalline piezoelectric polymer layer containing a helical chiral polymer (A) that has a weight average molecular weight of from 50,000 to 1,000,000 and has optical activity;
   an optical compensation layer satisfying the following expression (2):

$$|(0.06 \times Xc \times MORc \times d) + Rth| \leq 250 \qquad \text{expression (2):}$$

wherein, in expression (2), Xc represents the degree of crystallinity (%) of the crystalline piezoelectric polymer layer; MORc represents the standardized molecular orientation of the crystalline piezoelectric polymer layer; d represents the thickness (μm) of the crystalline piezoelectric polymer layer; and Rth represents the phase difference (nm) in the thickness direction of the optical compensation layer at a wavelength of 550 nm, and
   a linear polarizer.

2. The display device according to claim 1, wherein, in the crystalline piezoelectric polymer layer, the degree of crystallinity is from 20% to 80%, and a product of the standardized molecular orientation and the degree of crystallinity is from 25 to 700.

3. The display device according to claim 1, wherein there is no linear polarizer between the crystalline piezoelectric polymer layer and the optical compensation layer.

4. The display device according to claim 1, further comprising a liquid crystal cell or an organic electroluminescence element.

5. The display device according to claim 1, comprising a pair of linear polarizers and a liquid crystal cell, wherein
   the liquid crystal cell, the crystalline piezoelectric polymer layer, and the optical compensation layer are arranged between the pair of linear polarizers.

6. The display device according to claim 1, comprising a pair of linear polarizers and a liquid crystal cell, wherein
   the liquid crystal cell is disposed between the pair of linear polarizers; and
   the crystalline piezoelectric polymer layer and the optical compensation layer are arranged closer to a viewing side than the pair of linear polarizers.

7. The display device according to claim 1, further comprising an organic electroluminescence element, wherein the crystalline piezoelectric polymer layer and the optical compensation layer are arranged between the linear polarizer and the organic electroluminescence element.

8. The display device according to claim 1, further comprising an organic electroluminescence element, wherein the crystalline piezoelectric polymer layer and the optical compensation layer are arranged closer to a viewing side than the linear polarizer.

9. The display device according to claim 1, wherein an absorption axis of the linear polarizer and a crystal axis of the crystalline piezoelectric polymer layer are substantially parallel or substantially vertical to each other.

10. The display device according to claim 1, wherein the crystalline piezoelectric polymer layer further contains a stabilizer (B) having one or more of functional groups selected from the group consisting of a carbodiimide group, an epoxy group and an isocyanate group, and having a weight average molecular weight of from 200 to 60,000, and the stabilizer (B) is contained in an amount of from 0.01 part by weight to 10 parts by weight based on 100 parts by weight of the helical chiral polymer (A).

11. The display device according to claim 10, wherein the stabilizer (B) contains a stabilizer (B3) having, in one molecule, one functional group selected from the group consisting of a carbodiimide group, an epoxy group and an isocyanate group.

12. The display device according to claim 1, wherein the crystalline piezoelectric polymer layer has an internal haze for visible light rays of 50% or less, and a piezoelectric constant $d_{14}$, measured at 25° C. by a displacement method, of 1 pm/V or more.

13. The display device according to claim 1, wherein the helical chiral polymer (A) is a polylactic acid polymer having a main chain that contains a repeating unit represented by the following formula (1):

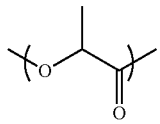
(1)

14. A laminated optical film comprising:
a crystalline piezoelectric polymer layer containing a helical chiral polymer (A) that has a weight average molecular weight of from 50,000 to 1,000,000 and has optical activity; and
an optical compensation layer satisfying the following expression (2):

$|(0.06 \times Xc \times MORc \times d) + Rth| \leq 250$      expression (2):

wherein, in expression (2), Xc represents the degree of crystallinity (%) of the crystalline piezoelectric polymer layer; MORc represents the standardized molecular orientation of the crystalline piezoelectric polymer layer; d represents the thickness (μm) of the crystalline piezoelectric polymer layer; and Rth represents the phase difference (nm) in the thickness direction of the optical compensation layer at a wavelength of 550 nm.

15. The laminated optical film according to claim 14, wherein, in the crystalline piezoelectric polymer layer, the degree of crystallinity is from 20% to 80%, and a product of the standardized molecular orientation and the degree of crystallinity is from 25 to 700.

16. The laminated optical film according to claim 14, wherein the crystalline piezoelectric polymer layer further contains a stabilizer (B) having one or more of functional groups selected from the group consisting of a carbodiimide group, an epoxy group and an isocyanate group, and having a weight average molecular weight of from 200 to 60,000, and the stabilizer (B) is contained in an amount of from 0.01 part by weight to 10 parts by weight based on 100 parts by weight of the helical chiral polymer (A).

17. The laminated optical film according to claim 16, wherein the stabilizer (B) contains a stabilizer (B3) having, in one molecule, one functional group selected from the group consisting of a carbodiimide group, an epoxy group and an isocyanate group.

18. The laminated optical film according to claim 14, wherein the crystalline piezoelectric polymer layer has an internal haze for visible light rays of 50% or less, and a piezoelectric constant $d_{14}$, measured at 25° C. by a displacement method, of 1 pm/V or more.

19. The laminated optical film according to claim 14, wherein the helical chiral polymer (A) is a polylactic acid polymer having a main chain that contains a repeating unit represented by the following formula (1):

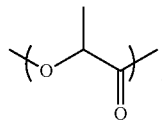
(1)

20. The laminated optical film according to claim 14, wherein the Rth is from −1500 nm to −200 nm.

* * * * *